US010535407B2

(12) United States Patent
Wong

(10) Patent No.: US 10,535,407 B2
(45) Date of Patent: Jan. 14, 2020

(54) ADAPTIVE PARALLEL WRITING TO NONVOLATILE MEMORY CELLS

(71) Applicant: Samsung Electronics Co., Ltd., Suwon-si (KR)

(72) Inventor: Sau Ching Wong, Reno, NV (US)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 35 days.

(21) Appl. No.: 15/403,091

(22) Filed: Jan. 10, 2017

(65) Prior Publication Data
US 2017/0125103 A1 May 4, 2017

Related U.S. Application Data

(62) Division of application No. 14/980,507, filed on Dec. 28, 2015, now Pat. No. 9,576,647, which is a division
(Continued)

(51) Int. Cl.
G11C 16/12 (2006.01)
G11C 11/56 (2006.01)
(Continued)

(52) U.S. Cl.
CPC .......... G11C 16/12 (2013.01); G11C 11/5628 (2013.01); G11C 11/5642 (2013.01);
(Continued)

(58) Field of Classification Search
CPC . G11C 16/12; G11C 16/3459; G11C 2216/14; G11C 16/3404; G11C 16/3463; G11C 2216/16
(Continued)

(56) References Cited

U.S. PATENT DOCUMENTS 5,043,940 A   8/1991 Harari
5,095,344 A   3/1992 Harari
(Continued)

FOREIGN PATENT DOCUMENTS

JP   11-134879   5/1999

OTHER PUBLICATIONS

Campardo, Giovanni et al., "40-mm2 3-V-Only 50-MHz 64-MB 2-v/Cell CHE NOR Flash Memory", IEEE Journal of Solid-State Circuits, Nov. 2000, vol. 35, No. 11.

Primary Examiner — Alfredo Bermudez Lozada
(74) Attorney, Agent, or Firm — Muir Patent Law, PLLC

(57) ABSTRACT

Adaptive write operations for non-volatile memories select programming parameters according to monitored programming performance of individual memory cells. In one embodiment of the invention, programming voltage for a memory cell increases by an amount that depends on the time required to reach a predetermined voltage and then a jump in the programming voltage is added to the programming voltage required to reach the next predetermined voltage. The adaptive programming method is applied to the gate voltage of memory cells; alternatively, it can be applied to the drain voltage of memory cells along a common word line. A circuit combines the function of a program switch and drain voltage regulator, allowing independent control of drain voltage of selected memory cells for parallel and adaptive programming. Verify and adaptive read operations use variable word line voltages to provide optimal biasing of memory and reference cells during sensing.

16 Claims, 24 Drawing Sheets

Related U.S. Application Data of application No. 12/645,224, filed on Dec. 22, 2009, now abandoned, which is a division of application No. 11/182,602, filed on Jul. 14, 2005, now Pat. No. 7,656,710.

(51) Int. Cl.
*G11C 16/10* (2006.01)
*G11C 16/34* (2006.01)

(52) U.S. Cl.
CPC .......... *G11C 16/10* (2013.01); *G11C 16/3454* (2013.01); *G11C 16/3459* (2013.01); *G11C 2211/5644* (2013.01)

(58) Field of Classification Search
USPC .................................................. 365/185.19
See application file for complete search history.

(56) References Cited

U.S. PATENT DOCUMENTS

| | | | |
|---|---|---|---|
| 5,163,021 A | 11/1992 | Mehrotra et al. | |
| 5,172,338 A | 12/1992 | Mehrotra et al. | |
| 5,293,560 A | 3/1994 | Harari | |
| 5,386,388 A | 1/1995 | Atwood et al. | |
| 5,440,505 A * | 8/1995 | Fazio ................. | G11C 11/5621 365/185.03 |
| 5,508,958 A | 4/1996 | Fazio et al. | |
| 5,570,315 A | 10/1996 | Tanaka et al. | |
| 5,583,812 A | 12/1996 | Harari | |
| 5,602,789 A | 2/1997 | Endoh et al. | |
| 5,642,312 A | 6/1997 | Harari | |
| 5,677,869 A | 10/1997 | Fazio et al. | |
| 5,694,357 A | 12/1997 | Mori | |
| 5,701,266 A | 12/1997 | Fazio et al. | |
| 5,729,489 A | 3/1998 | Fazio et al. | |
| 5,757,699 A | 5/1998 | Takeshima et al. | |
| 5,768,191 A | 6/1998 | Choi et al. | |
| 5,774,397 A * | 6/1998 | Endoh ................. | G11C 11/5621 365/185.03 |
| 5,796,652 A | 8/1998 | Takeshima et al. | |
| 5,801,989 A | 9/1998 | Lee et al. | |
| 5,812,457 A | 9/1998 | Arase | |
| 5,828,616 A | 10/1998 | Bauer et al. | |
| 5,892,710 A | 4/1999 | Fazio et al. | |
| 5,892,714 A | 4/1999 | Choi | |
| 5,909,390 A | 6/1999 | Harari | |
| 5,912,838 A | 6/1999 | Chevallier | |
| 5,923,588 A | 7/1999 | Iwahashi | |
| 5,926,409 A * | 7/1999 | Engh ................. | G11C 11/5621 365/185.03 |
| 5,949,714 A * | 9/1999 | Hemink ................. | G11C 16/12 365/185.17 |
| 6,004,848 A | 12/1999 | Shone | |
| 6,011,715 A | 1/2000 | Pasotti et al. | |
| 6,014,327 A | 1/2000 | Banks | |
| 6,014,330 A | 1/2000 | Endoh et al. | |
| 6,038,166 A | 3/2000 | Wong | |
| 6,038,174 A | 3/2000 | Khan et al. | |
| 6,040,993 A | 3/2000 | Chen et al. | |
| 6,046,934 A | 4/2000 | Lin | |
| 6,058,060 A | 5/2000 | Wong | |
| 6,091,631 A | 7/2000 | Kucera et al. | |
| 6,094,368 A | 7/2000 | Ching | |
| 6,097,639 A | 8/2000 | Choi et al. | |
| 6,134,141 A | 10/2000 | Wong | |
| 6,134,145 A | 10/2000 | Wong | |
| 6,134,148 A | 10/2000 | Kawahara et al. | |
| 6,149,316 A | 11/2000 | Harari et al. | |
| 6,175,937 B1 | 1/2001 | Norman et al. | |
| 6,219,276 B1 | 4/2001 | Parker | |
| 6,222,762 B1 | 4/2001 | Guterman et al. | |
| 6,259,627 B1 | 7/2001 | Wong | |
| 6,278,633 B1 | 8/2001 | Wong et al. | |
| 6,285,598 B1 | 9/2001 | Khan et al. | |
| 6,292,396 B1 | 9/2001 | Tailliet | |
| 6,301,151 B1 | 10/2001 | Engh et al. | |
| 6,301,161 B1 | 10/2001 | Holzmann et al. | |
| 6,314,025 B1 | 11/2001 | Wong | |
| 6,324,094 B1 | 11/2001 | Chevallier | |
| 6,327,183 B1 * | 12/2001 | Pawletko ............... | G11C 5/147 365/185.18 |
| 6,330,185 B1 | 12/2001 | Wong et al. | |
| 6,343,033 B1 | 1/2002 | Parker | |
| 6,392,931 B1 | 5/2002 | Pasotti et al. | |
| 6,462,986 B1 | 10/2002 | Khan | |
| 6,466,481 B1 | 10/2002 | Pasotti et al. | |
| 6,490,204 B2 | 12/2002 | Bloom et al. | |
| 6,493,265 B2 | 12/2002 | Satoh et al. | |
| 6,496,418 B2 | 12/2002 | Kawahara et al. | |
| 6,525,961 B2 | 2/2003 | Rolandi et al. | |
| 6,538,923 B1 | 3/2003 | Parker | |
| 6,542,403 B1 | 4/2003 | Parker | |
| 6,556,475 B2 | 4/2003 | Yamazaki et al. | |
| 6,606,267 B2 | 8/2003 | Wong | |
| 6,643,188 B2 * | 11/2003 | Tanaka ................. | G11C 11/5628 365/189.16 |
| 6,661,707 B2 | 12/2003 | Choi et al. | |
| 6,707,719 B2 | 3/2004 | Shibata et al. | |
| 6,714,448 B2 | 3/2004 | Manea | |
| 6,724,656 B2 | 4/2004 | Banks | |
| 6,738,289 B2 | 5/2004 | Gongwer et al. | |
| 6,747,892 B2 | 6/2004 | Khalid | |
| 6,747,893 B2 | 6/2004 | Uribe et al. | |
| 6,751,129 B1 | 6/2004 | Gongwer | |
| 6,788,579 B2 | 9/2004 | Gregori et al. | |
| 6,807,097 B2 | 10/2004 | Takano et al. | |
| 6,822,909 B1 | 11/2004 | Hamilton et al. | |
| 6,829,172 B2 | 12/2004 | Bloom et al. | |
| 6,831,858 B2 | 12/2004 | Hirano et al. | |
| 6,856,551 B2 | 2/2005 | Mokhlesi et al. | |
| 6,870,763 B2 | 3/2005 | Banks | |
| 6,882,567 B1 * | 4/2005 | Wong ................. | G11C 11/5628 365/185.03 |
| 6,888,758 B1 | 5/2005 | Hemink et al. | |
| 6,894,926 B2 | 5/2005 | Guterman et al. | |
| 6,906,951 B2 | 6/2005 | Wong | |
| 7,020,026 B2 | 3/2006 | Guterman et al. | |
| 7,057,934 B2 | 6/2006 | Krishnamachari et al. | |
| 7,057,936 B2 | 6/2006 | Yaegashi et al. | |
| 7,116,581 B2 | 10/2006 | Suzuki et al. | |
| 7,136,304 B2 | 11/2006 | Cohen et al. | |
| 7,139,198 B2 | 11/2006 | Guterman et al. | |
| 7,173,859 B2 | 2/2007 | Hemink | |
| 7,227,783 B2 | 6/2007 | Li | |
| 7,230,852 B2 | 6/2007 | Mitani et al. | |
| 2002/0191444 A1 | 12/2002 | Gregori et al. | |
| 2003/0107919 A1 | 6/2003 | Yano et al. | |
| 2005/0047214 A1 * | 3/2005 | Kim ....................... | G11C 16/12 365/185.28 |
| 2005/0248989 A1 * | 11/2005 | Guterman ............... | G11C 16/30 365/185.28 |
| 2006/0245262 A1 * | 11/2006 | Li ........................... | G11C 16/10 365/185.28 |

\* cited by examiner

ADAPTIVE PARALLEL WRITING TO NONVOLATILE MEMORY CELLS

CROSS-REFERENCE TO RELATED APPLICATIONS

This patent document is a divisional and claims benefit of the earlier priority date of U.S. patent application Ser. No. 14/980,507, filed Dec. 28, 2015, which is a divisional of U.S. patent application Ser. No. 12/645,224, filed Dec. 22, 2009 (now abandoned), which is a divisional of U.S. patent application Ser. No. 11/182,602, filed Jul. 14, 2005 (now U.S. Pat. No. 7,656,710, issued Feb. 2, 2010), all of which are hereby incorporated by reference in their entirety.

BACKGROUND

Flash memories and other similar non-volatile memories store data in a memory cell by programming the threshold voltage of a transistor (e.g., a floating gate transistor) in the memory cell to a level that corresponds to the data being stored. For example, storing a single bit of data in this type of memory cell requires erase and programming operations that can consistently set the threshold voltages of transistors to either of two different threshold voltage levels that can be distinguished without errors during read operations. Storing N bits in a memory generally requires programming that can set a transistor in any of $2^N$ or $(2^N-1)$ different threshold voltage levels that can be distinguished from each other without error during subsequent read operations. Since the structure and operating voltage of memory cells limit the available range of useable threshold voltages, programming operations become exponentially more difficult as the number of bits stored per memory cell increases.

A primary difficulty when storing four or more bits of data in a Flash memory cell is the unavoidable variation in the programming characteristics or performance of the memory cells. In particular, known programming mechanisms including Channel Hot Electron (CHE) injection and Fowler-Nordheim (FN) tunneling will be more efficient in some memory cells in a memory array causing faster programming (e.g., faster threshold voltage changes) of some "fast" memory cells. On the other hand, some memory cells in the same memory array will be less efficient causing slower programming (e.g., slower threshold voltage changes) of some "slow" memory cells. The variations in programming characteristics or performance are difficult or impossible to eliminate because the variations arise from a variety of factors and effects. Variations during manufacturing processes across a wafer and across wafers in a wafer lot, and differences in the location of memory cells within a memory array or within an integrated circuit, for example, can cause the memory cells to perform differently. Further, even if two memory cells had identical programming performance when new, different use of the memory cells, e.g., storage of different data values or being subject to differing numbers of programming and erase operations, can change the memory cells over time so that the two memory cells no longer have the same programming characteristics.

Another difficulty for programming operations is achieving a high data I/O rate. A programming operation designed to program a fast memory cell with the required threshold voltage accuracy for four or more bits per memory cell (≥4 bpc) may require an unacceptably long time for programming of slow memory cells. In such cases, the slow memory cells could be indicated as defective, causing low manufacturing yield and/or short product life, or the poor performance of the slow memory cells limit the data I/O rate of the memory during writing. Alternatively, a programming operation designed for slow-programming memory cells (e.g., programming operations using higher applied programming voltages) may cause rapid changes in the threshold voltages of fast memory cells, resulting in inaccurate programming of the fast memory cells. Circuits and methods for quickly and accurately programming both fast and slow nonvolatile memory cells within a memory array or an integrated circuit are therefore desired.

Read operations for multi-bit-per-cell memory need to accurately measure or quantify a memory cell's threshold voltage in order to determine the multi-bit data stored. However, the size of each threshold voltage window representing a data value decreases by a factor ($2^N-1$), where N is the number of bits stored in the memory cell. The reduced threshold voltage window size would reduce the sensing margin, i.e., the threshold voltage difference between the selected memory cell and reference cell. Differentiating such a small delta signal requires a highly-sensitive sense amplifier with memory and reference cell data paths that are well balanced in terms of capacitive, resistive, noise, and coupling effects. In order to maximize the delta signal read out from the memory and reference cells, it is important to bias both cells in an operating region where changes in current flow is most sensitive to changes in threshold voltage. Furthermore, Flash memories with random access feature require high speed reading of a number of memory cells in less than about 100 ns, which further challenges the read operation. Therefore, circuits and methods for quickly and accurately reading multi-bit-per-cell nonvolatile memories are desired.

SUMMARY

In accordance with an aspect of the invention, adaptive programming of nonvolatile memory cells identify the time or programming voltages required to achieve predetermined threshold voltage levels during programming and selects subsequent programming parameters accordingly. The programming operation can thus identify slow programming memory cells and use higher programming voltages to achieve the required programming rate. Additionally, the programming operation can identify fast programming memory cells and use lower programming voltages to achieve the required programming accuracy.

In one specific embodiment of the invention, a programming operation applies a word line programming voltage that increases in relatively small steps until the threshold voltage of a selected memory cell reaches a first predetermined voltage. If the selected memory cell is a fast programming memory cell, only a small number of voltage steps are required to reach the first predetermined voltage, but if the selected memory cell is a slow programming memory cell, a larger number of voltage steps are required to reach the first predetermined voltage. The resulting word line programming voltage when the first predetermined voltage is reached will thus be lower if the selected memory cell is a fast memory cell than if the selected memory cell is a slow memory cell. In either case, a larger voltage step (e.g., about equal to a difference between the first predetermined voltage and a second predetermined voltage) is added to the resulting word line programming voltage before further programming using a series of small voltage steps to increase the threshold voltage of the selected memory cell to the second predetermined voltage. A relatively larger voltage step can again be added to the resulting word line programming voltage before programming using a further series of small voltage steps to increase the threshold voltage of the selected memory cell to the next predetermined voltage. The programming operation stops when the threshold voltage reaches a target threshold voltage representing the data value being written. In this embodiment, the programming operation adapts to the programming performance of a memory cell by using higher word line programming voltages for slower memory cells and lower word line programming voltages for faster programming memory cells. Alternative embodiments of the inventions use different permutations of variable program pulse widths and/or variable programming voltage increments to further improve the adaptive write operation.

In accordance with a further aspect of the invention, the number of predetermined voltages can affect the effectiveness of the adaptive programming methods. Use of one or more predetermined voltages in between target threshold voltages especially early in the write operation can improve the adaptive write operation by allowing the programming voltage to quickly adapt to the programming speed of the memory cell.

In accordance with a further aspect of the invention, a non-volatile memory employs segmented word lines that allow independent control of word line programming voltages on local word line segments. High data I/O rates and programming accuracy can thus be achieved through parallel adaptive programming of multiple memory cells associated with the same global word line but different local word line segments.

In accordance with a further aspect of the invention, a non-volatile memory can employ common word lines that allow parallel adaptive programming of a number of selected memory cells along the selected word line. Alternative embodiments of the invention employ adaptive programming methods by applying a programming voltage to the selected bit line that intelligently and dynamically adjusts, higher or lower, based on a number of input variables; and applying different word line programming voltage waveforms to the selected word line, including: a uniform voltage waveform, a gradually increasing "staircase" voltage waveform with multiple programming sequences, and an incrementally increasing voltage waveform.

In accordance with a further aspect of the invention, a non-volatile memory employs a circuit combining the functions of a program switch and drain voltage regulator, which improves the controllability of the drain voltage during write operations and reduces the required circuit area. The drain voltage, which could be varied in each program pulse, is optimally selected based on a number of input variables. An alternative embodiment of the invention can use individual program switches and drain voltage regulators for programming multiple memory cells along a selected word line; thereby allowing independent control of drain voltage based on a number of input variables during the adaptive write operation.

In accordance with a further aspect of the invention, a verify operation uses a variable verify word line voltage according to the predetermined voltage that the selected memory cell is being programmed to. This provides a uniform and consistent biasing of both reference cells and memory cells in the same (optimal) operating region in which current flow is most sensitive to threshold voltage shifts.

In accordance with a further aspect of the invention, an adaptive read operation uses a variable word line voltage that changes according to the selected reference cell's threshold voltage in each of the consecutive read cycles necessary to discriminate the multi-bit value stored. Applying a gate voltage near the selected reference cell's threshold voltage maximizes the delta signal necessary for sensing the small difference in threshold voltages between the selected reference cell and memory cell, because both the reference cell and the selected memory cell (with threshold voltage near reference cell's threshold voltage) are similarly biased in an operating region in which the current flow is most sensitive to threshold voltage shifts. In one embodiment, the first read cycle compares the currents through a memory cell and a first reference cell with threshold voltage at a mid point between the lowest and highest target threshold voltages, and biases the word line voltage to a level about equal to the threshold voltage of the first reference cell. Depending on the result of the first read cycle, selecting a second or third reference cell and a corresponding word line voltage for comparison in the second read cycle to finally read out the multi-bit data value stored. Independent source biasing can be used effectively for an adaptive read operation of non-volatile memories with common or continuous word line array architectures.

BRIEF DESCRIPTION OF THE DRAWINGS

Use of the same reference symbols in different figures indicates similar or identical items.

DETAILED DESCRIPTION

In accordance with an aspect of the invention, an adaptive programming operation for a non-volatile memory measures times or programming voltages required for the threshold voltage of a selected memory cell to reach a series of predetermined voltages. The predetermined voltages may be target threshold voltages representing data values or may be between the target threshold voltages representing data values. When the threshold voltage of a selected memory cell reaches a predetermined voltage, the memory uses the time or programming voltages required to reach the predetermined voltage in selection of the programming parameters for further programming of the selected memory cell. The programming characteristics or parameters thus adapt to the specific programming performance of the selected memory cell.

Figure 1:
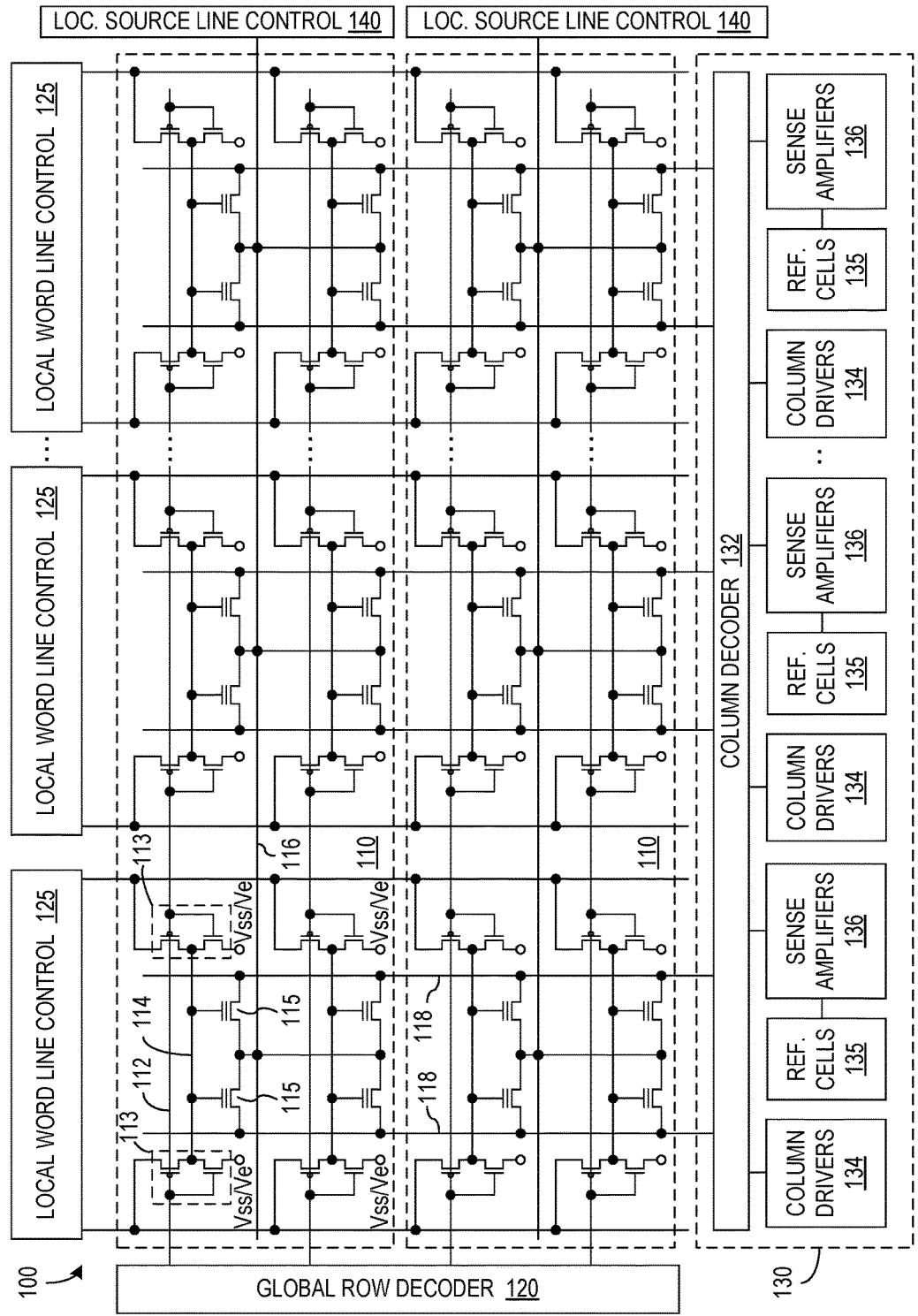
FIG. 1 illustrates an architecture for a nonvolatile memory in accordance with an embodiment of the invention having segmented word lines.

FIG. 1 illustrates a non-volatile memory 100 in accordance with an embodiment of the invention. Memory 100 includes an array of non-volatile memory cells 115 that are organized into multiple sectors 110. In the illustrated embodiment, each memory cell 115 includes a floating gate transistor having a control gate coupled to a local word line 114, a source coupled to a source line 116, and a drain coupled to a column line 118. Alternatively, each memory cell can be a multi-transistor memory cell, a split gate memory cell, a source-side injection memory cell, a bi-directional, nitride charge-trapping memory cell that trap charges at both its drain and source, or any type of memory cell having a threshold voltage that can be programmed to represent a multi-bit data value.

In the illustrated embodiment, memory 100 is a Flash memory, and each sector 110 of memory cells 115 is erasable as a group using well-known electrical erasure techniques. In particular, each sector 110 has a number of local word line control circuits 125 and a corresponding local source line control circuit 140 capable of applying voltages that cause Fowler-Nordheim tunneling between the floating-gates of the memory cells and the P-substrate or P-well. The tunneling effect lowers the threshold voltages of all memory cells 115 in the sector 110 to an erased level.

A global row decoder 120 and column circuits 130 select memory cells 115 for access during a read or write operation. During a memory access, global row decoder 120 receives a row address signal and activates a global word line 112 corresponding to the row address signal. Address decoding circuits and high-voltage drivers of this type are well known and can be implemented using known techniques. In the illustrated embodiment, global row decoder 120 activates a selected global word line 112 by discharging the voltage on the selected global word line 112 to an active state (e.g., to ground.) The unselected global word lines 112 remain in an inactive state (e.g., at internal high supply voltage Vhh). The states of global word lines 112 control local selection devices 113 in sectors 110, and in each sector 110, local selection devices 113 associated with the selected global word line 112 connect a local word line control circuit 125 to the local word line 114 associated with the selected global word line 112 in selected sector 110.

FIG. 1 shows two sets of local word-line select devices 113, one on each end of the local word lines 114, which effectively reduces the RC time-constant along the local word-line by ¼. Alternatively, a single set of local word-line select devices 113 can be used for each local word-line 114 to minimize circuit and layout overheads.

Local word line control circuits 125 can independently control the voltages on the respective local word lines 114 to implement erase, read, and/or write operations. A write operation as described further below includes program pulses having parameters that adapt according to the measured programming characteristics or performance of a memory cell 115 during a verify operation. In particular, during each program pulse of a write operation, each control circuit 125 drives a selected local word line 114 to a word line programming voltage that when combined with appropriate column and source line programming voltages causes the threshold voltage of the selected memory cell to increase (e.g., via channel hot electron injection). During verify operation, each control circuit 125 lowers the selected local word line 114 to a verify word line voltage for sensing of the threshold voltage of the selected memory cell. The results of the verify operation can be used to select the word line programming voltage or other programming parameters used during subsequent program pulses.

Column circuits 130, including a column decoder 132, column drivers 134, reference cells 135, and sense amplifiers 136, connect to column lines 118. Column decoder 132 decodes a column address signal to select column lines 118 during a read or write operation. During each program pulse of a write operation, column drivers 134 drive a number of selected column lines 118 in selected sector 110 to column line programming voltages. During each verify operation, sense amplifiers 136 compare the threshold voltage of a number of selected memory cells 115 against the threshold voltage of the corresponding reference cells 135. As described further below, each local word line control circuit 125 communicates with column circuits 130 so that local word line control circuits 125 can select the word line programming voltage according to when the corresponding sense amplifier 136 senses that the selected memory cell has reach a predetermined threshold voltage represented by the corresponding reference cells 135. During each read operation, sense amplifiers 136 compare the threshold voltage of a number of selected memory cells 115 against the threshold voltage of the corresponding reference cells 135 to accurately determine the multi-bit value stored in the selected memory cells.

FIG. 1 shows memory 100 with a continuous common column line 118. Alternatively, column line 118 can be divided into multiple segments with added local column decoders and local column select devices to select which one of the local column lines is to be connected to the global column lines, which connects to column decoder 132. Since this so-called "Divided Bit line" array architecture limits the number of memory cells per column line, it effectively lowers column-line capacitance and leakage, and (naturally) defines the boundary of sector 110.

Figure 2:
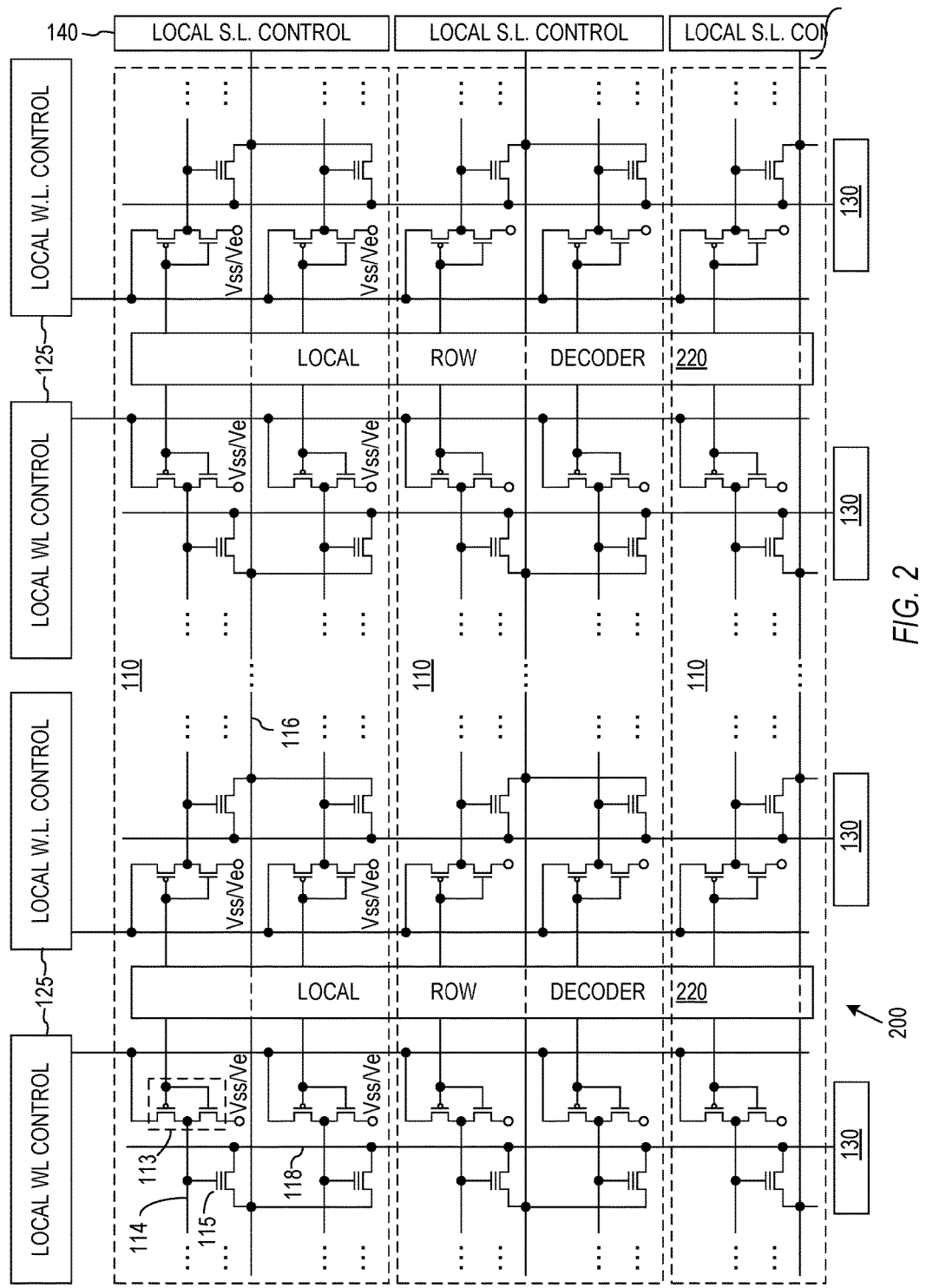
FIG. 2 illustrates an architecture for a nonvolatile memory in accordance with an embodiment of the invention having multiple row decoders and word line segments on opposite sides of each row decoder.

FIG. 2 shows a non-volatile memory 200 having another architecture providing sectors 110 with local word lines 114 that can be independently controlled for adaptive programming of memory cells 115. Non-volatile memory 200 differs from memory 100 in having multiple local row decoders 220 in place of the global row decoder 120 in FIG. 1. Each local row decoder 220 is located between adjacent memory arrays belonging to the same sectors 110 and directly controls word-line selection devices 113 in the adjacent memory arrays. Accordingly, memory 200 does not require global word lines that extend across the entire memory cell array as in the case for memory 100.

For an access operation in memory 200, each local row decoder 220 decodes a row address signal and activates word-line selection devices 113 corresponding to a selected row of memory cells 115 in sector 110. Word-line selection devices 113 then connect the selected row of memory cells 115 to corresponding local word line control circuits 125. Local word line control circuits 125 and column circuits 130 can then control the voltages applied to selected memory cells 115 for adaptive programming of the selected memory cells 115.

FIG. 2 shows memory 200 with two local row decoders 220. Alternatively, memory 200 can use one, three, or more local row decoders 220. In a manner similar to memory 100, the effective program or write bandwidth for memory 200 is directly proportional to the number of segments of local word lines corresponding to a selected row address. Therefore, there is a trade-off between circuit and layout overheads required to support each local word-line segment and program or write bandwidth. Table 1 lists examples of the different permutations of array architectures possible for memory 100 and memory 200.

TABLE 1

| Memory Array Architecture | Number of Row Decoders 120 or 220 | Number of Local Word Line Segments 114 & W/L Control Ckt. 125 per Row Decoder | Number of Bits Per Cell | Effective Program Bandwidth | |
|---|---|---|---|---|---|
| | | | | Number of Memory Cells Programmed in Parallel | Equivalent Number of Bits Programmed in Parallel |
| Memory 100 in FIG. 1 | 1 | 1 | 1-bpc | 1 | 1 |
| | | | 2-bpc | 1 | 2 |
| | | | 3-bpc | 1 | 3 |
| | | | 4-bpc | 1 | 4 |
| | | 2 | 1-bpc | 2 | 2 |
| | | | 2-bpc | 2 | 4 |

TABLE 1-continued

| Memory Array Architecture | Number of Row Decoders 120 or 220 | Number of Local Word Line Segments 114 & W/L Control Ckt. 125 per Row Decoder | Number of Bits Per Cell | Effective Program Bandwidth | |
|---|---|---|---|---|---|
| | | | | Number of Memory Cells Programmed in Parallel | Equivalent Number of Bits Programmed in Parallel |
| | | | 3-bpc | 2 | 6 |
| | | | 4-bpc | 2 | 8 |
| | | 4 | 1-bpc | 4 | 4 |
| | | | 2-bpc | 4 | 8 |
| | | | 3-bpc | 4 | 12 |
| | | | 4-bpc | 4 | 16 |
| | | 8 | 1-bpc | 8 | 8 |
| | | | 2-bpc | 8 | 16 |
| | | | 3-bpc | 8 | 24 |
| | | | 4-bpc | 8 | 32 |
| Memory 200 in FIG. 2 | 1 | 2 | 1-bpc | 2 | 2 |
| | | | 2-bpc | 2 | 4 |
| | | | 3-bpc | 2 | 6 |
| | | | 4-bpc | 2 | 8 |
| | 2 | 4 | 1-bpc | 4 | 4 |
| | | | 2-bpc | 4 | 8 |
| | | | 3-bpc | 4 | 12 |
| | | | 4-bpc | 4 | 16 |
| | 4 | 8 | 1-bpc | 8 | 8 |
| | | | 2-bpc | 8 | 16 |
| | | | 3-bpc | 8 | 24 |
| | | | 4-bpc | 8 | 32 |

Alternatively, each of the local word line segments 114 in memory 200 can be a common word line gating a number of selected memory cells to be programmed in parallel. A corresponding number of column decoders, reference cells, and sense amplifiers in column circuit 130 associated with the selected local word line segment are selected. Alternatively, two or more local word line segments, each containing a number of selected memory cells, can be selected to further increase the I/O bandwidth.

Figure 3A:
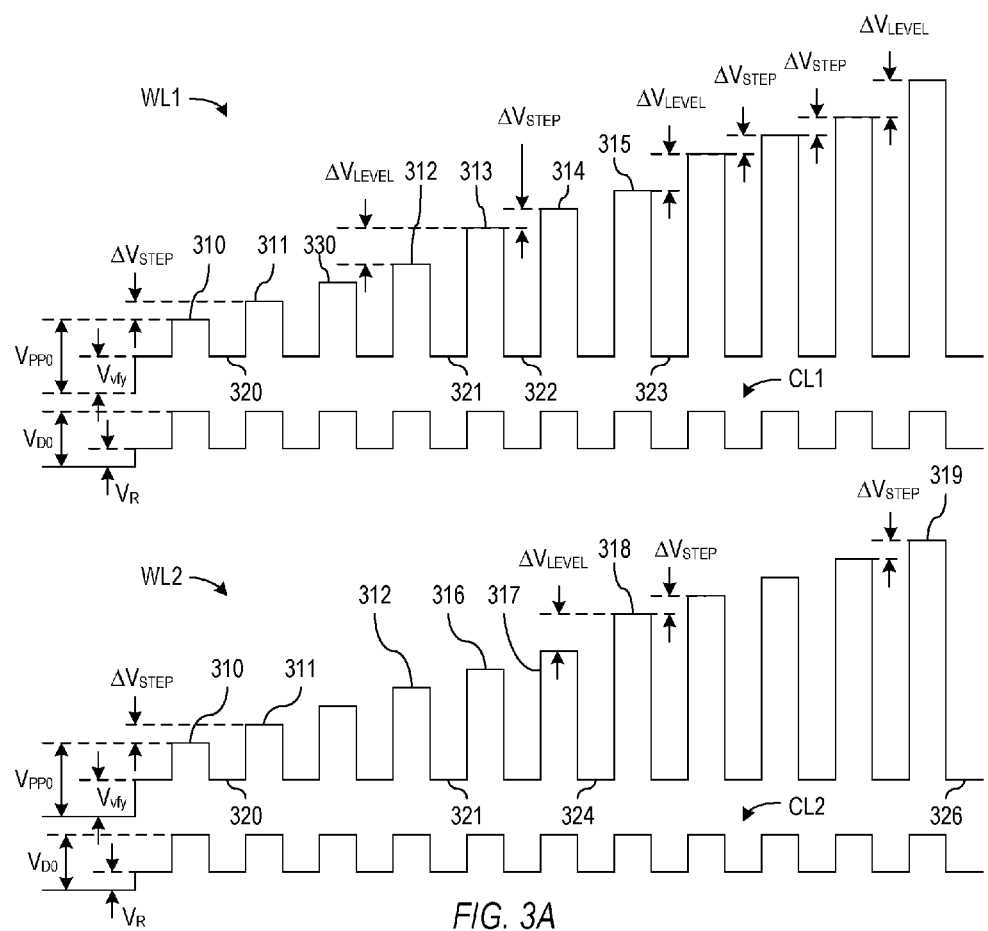
FIGS. 3A and 3B show timing diagrams of applied programming signals during adaptive programming operations in accordance with alternative embodiments of the invention.

FIG. 3A shows timing diagrams for signals WL1 and WL2 respectively on selected local word lines, and signals CL1 and CL2 respectively on selected column lines during an adaptive write operation in accordance with an embodiment of the invention. For ease of illustration, FIG. 3A shows signals WL1, WL2, CL1, and CL2 for only the beginning of the write operation where the threshold voltages of the selected memory cells are programmed to a first few predetermined voltages. The full write operation can continue in the same fashion as illustrated in FIG. 3A and described below to raise the threshold voltages of the selected memory cells to a series of predetermined voltages up to the highest target threshold voltage level. The programming of each selected memory cell stops when the threshold voltage of the memory cell reaches the target threshold voltage representing the multi-bit data value being written in the selected memory cell.

As an illustrative example, signals WL1 and CL1 correspond to a selected memory cell that is a relatively fast-programming memory cell, and signals WL2 and CL2 correspond a selected memory cell that is a relatively slow-programming memory cell. In a memory architecture having segmented word lines as in memories 100 and 200 of FIGS. 1 and 2, the adaptive write operations, which includes program and verify operations, can efficiently write to both fast and slow memory cells simultaneously. In a non-volatile memory having continuous or common word lines, the programming voltage on the selected word line Vpp can adapt for programming of a selected memory cell, and the write operations for two or more memory cells on the same continuous word line can be conducted sequentially. In this embodiment, the selected continuous word line and drain signals are activated to adaptively program the first selected memory cell in the first selected column driven by the drain signal CL1. After the first selected memory cell has completed the adaptive programming sequence and reached its final target voltage, the next adaptive programming sequence starts. Drain signal CL2 is activated to adaptively program the second selected memory cell in the second selected column driven by the drain signal CL2. Since the programming of two or more memory cells on a continuous or common word line requires serial adaptive programming sequences, the total programming time is slower than segmented word line architecture. However, write performance in a continuous or common word line architecture using an adaptive word line programming voltage can be increased through use of other methods described below.

The write operations of FIG. 3A starts with program pulses 310 with uniform pulse width for both selected memory cells. During the first program pulse 310, a voltage $V_{PP0}$ is applied to the selected local word lines, a voltage $V_{D0}$ is applied to the selected column lines, and the source lines are at a reference voltage (e.g., ground). The applied programming voltages preferably cause Channel Hot Electron (CHE) injection that raises the threshold voltages of the selected memory cells by injection of channel hot electrons through an insulating layer into floating gates of the selected memory cells. Generally, the required voltages $V_{PP0}$ and $V_{D0}$ and the duration of program pulse 310 will depend on the type, characteristics, and design of the memory cells and the range of threshold voltages used for data storage. For current conventional floating-gate Flash memory cells having a useable threshold voltage range between about 3 volts and about 6 volts, voltage $V_{PP0}$ would typically between about 5 volts and about 6 volts, the range of word line programming voltage Vpp is typically be between about 5 volts and about 10 volts, voltage $V_{D0}$ would typically be between about 4 volts and about 5 volts, and program pulse 310 is typically about one hundred nanoseconds to less than about 1 microsecond long.

Verify operation 320 after program pulses 310 sense the threshold voltages of the selected memory cells to determine whether the memory cells have reached the first predetermined voltage. The sensing operation implemented with signals WL1 and CL1 (or with signals WL2 and CL2) in FIG. 3A applies a verify voltage Vvfy which is typically higher than the first predetermined voltage, to the local word line connected to the selected memory cell, charges the selected column line to a read voltage $V_R$ (typically less than about 1 volts), and grounds the source lines. A differential sense amplifier connected to the selected column line and a reference column line containing a first reference cell with its threshold voltage pre-set to the first predetermined voltage senses the difference in threshold voltages between the selected memory cell and the first reference cell. Differential sense amplifiers typically require that verify operation 320 be sufficiently long, e.g. longer than the typical read access time of less than about 100 ns, in order to sense whether the threshold voltage of selected memory cell is less than or more than the first predetermined voltage.

The predetermined voltage for verify operations 320 to 321 associated with word line and drain signals WL1 and CL1 in the illustrated embodiment is a first predetermined voltage. As described further below, a number of predetermined voltages used in the adaptive programming process can be about equal to target threshold voltages that represent data, or between the target threshold voltages that represent data, or can be at other voltage levels selected for evaluation of the programming speed of the memory cells. One or more predetermined voltages can be added between target threshold voltages depending on the desired granularity of adaptiveness. The programming parameters for program pulse 310 (e.g. voltages $V_{PP0}$ and $V_{D0}$, and the duration of program pulse 310) are preferably selected so that the first program pulse 310 keeps the threshold voltages of even the fastest programming memory cells below the first predetermined voltage.

A series of program pulses 311 to 312, which are interleaved with verify operations 320 to 321 apply an increasing word line programming voltage. In FIG. 3A, each program pulse 311 to 312 increases the voltage of local word line signal WL1 by a constant voltage step $\Delta V_{STEP}$. Voltage step $\Delta V_{STEP}$ generally depends on the threshold voltage resolution required for the programming operation, which in turn depends on the number of target threshold voltage levels for storing data, the range of threshold voltages available for data storage, and target programmed threshold voltage resolution or charge-placement accuracy requirement. For example, storage of four bits of data per memory cell requires a minimum of fifteen target threshold voltages if the erased threshold voltage represents one of the data values. A separation of 200 mV between the target threshold voltages thus requires a 3-volt range of available threshold voltages, and threshold voltages generally should be programmed to resolution better than or equal to about 25 mV, in order to ensure sufficient margin for sensing during subsequent read operations. The constant voltage step $\Delta V_{STEP}$ would preferably be equal to or less than the target programmed threshold voltage resolution, which in this example is about 25 mV. $\Delta V_{STEP}$ is preferably set equal to the target programmed threshold voltage resolution because for floating-gate memory cells, it is well-known that after its threshold voltage reaches the "saturation" threshold voltage corresponding to the applied word-line programming voltage Vpp any further threshold voltage increases $\Delta$Vt will equal to or limited by further increases $\Delta$Vpp in word line programming voltage Vpp. In alternative embodiments, the word line programming voltage during a series of program pulses can generally increase in any desired manner that achieves the desired threshold voltage resolution when the memory cell reaches its target threshold voltage; after which the programming operation terminates.

Verify operations 320 to 321 for the memory cells are substantially identical and sense whether the threshold voltages of the selected memory cells are less than or more than the first predetermined voltage. In FIG. 3A, verify operation 321 detects that the threshold voltage of the fast memory cell is equal to or greater than the first predetermined voltage, but the threshold voltage of the slow memory cell is still less than the first predetermined voltage. A next program pulse 313 for the fast memory cell increases the word line programming voltage by a level jump voltage $\Delta V_{LEVEL}$, which is generally greater than the step voltage $\Delta V_{STEP}$. Level jump voltage $\Delta V_{LEVEL}$ can be ideally selected according to the difference between adjacent predetermined voltages, such as between the first predetermined voltage and the second predetermined voltage. For example, if the first and second predetermined voltages are equal to target threshold voltages representing data values and are about 200 mV apart, level jump voltage $\Delta V_{LEVEL}$ can be selected to be equal to or less than about 200 mV.

After the level jump for the fast memory cell with $\Delta V_{LEVEL}$, a verify operation 322 senses whether the threshold voltage of the fast memory cell is greater than the second predetermined voltage. Level jump voltage $\Delta V_{LEVEL}$ is preferably such that the threshold voltage of the fast memory cell is equal to or less than the second predetermined voltage after program pulse 313, and none, one, or more program pulses 314 to 315 using word line programming voltages that increase in voltage steps $\Delta V_{STEP}$ are required to raise the threshold voltage of the fast memory cell to the second predetermined voltage. In an exemplary embodiment, level jump voltage $\Delta V_{LEVEL}$ is equal to the difference between adjacent predetermined voltages minus the target programmed threshold voltage resolution, e.g., $\Delta V_{LEVEL}$=200 mV−25 mV=175 mV. Alternatively, level jump voltage $\Delta V_{LEVEL}$ is equal to the difference between adjacent predetermined voltages, e.g., $\Delta V_{LEVEL}$=200 mV.

The verify process after program pulse 313 in FIG. 3A compares the threshold voltage of the fast memory cell to the second predetermined voltage by setting the local word line voltage for the fast memory cell to voltage Vvfy during verify operations 322 to 323, while sensing the difference in conductivity between the fast memory cell and a second reference cell with its threshold voltage pre-set to the second predetermined voltage.

The programming of the slow memory cell associated with word line and drain signals WL2 and CL2 differs from the programming of the fast memory cell after verify operation 321 determines that the threshold voltage of the fast memory cell is equal to or greater than the first predetermined voltage but the threshold voltage of the slow memory cell is still less than the first predetermined voltage. In this example, after verify operation 321, one or more program pulses 316 to 317 continue to use slowly increasing word line programming voltages (e.g. incrementing by step voltage $\Delta V_{STEP}$) to program the slow memory cell to the first predetermined voltage within the target programmed threshold voltage resolution or charge-placement accuracy. After a program pulse 317 raises the threshold voltage of the slow memory cell to the first predetermined voltage, a verify operation 324 senses the threshold voltage of the slow memory cell is at or above the first predetermined voltage, and the sensing circuitry then signals local word line control circuitry 125 (shown in FIG. 1 or 2) to increase the word line programming voltage by the level jump voltage $\Delta V_{LEVEL}$ for the following program pulse 318.

One or more program pulses 318 to 319 having slowly increasing word line programming voltage (e.g., incrementing by step voltage $\Delta V_{STEP}$) increase the threshold voltage of the slow memory cell until a verify operation 326 senses that the threshold voltage of the slow memory cell has reached the second predetermined voltage. Program pulses 318 to 319, which raise the threshold voltage of the slow memory cell from the first predetermined voltage to the second predetermined voltage, use higher word line programming voltages than do program pulses 313 to 315 for the fast memory cell. The higher word line programming voltage results from the longer series of program pulses 310, 311 to 312, 316, and 317 with more voltage steps $\Delta V_{STEP}$ (which raise the threshold voltage of the slow memory cell to the first predetermined voltage) effectively increases the basis of the word line programming voltages Vpp for subsequent program pulses. Applying different word line voltages for fast and slow memory cells during parallel programming is possible in a memory with a segmented word line architectures as shown in FIG. 1 or 2. The higher word line programming voltages for program pulses 318 to 319 tend to equalize the rates at which the threshold voltages of the slow memory cell and the fast memory cell proceed from the first predetermined voltage to the second predetermined voltage. The difference between times required to program fast and slow memory cells to the same threshold voltage level are thus limited to a delay required for the adaptive programming operation to raise the programming rate of the slow memory cells to match the programming rate of the fast memory cells. Throughout the rest of the programming process, the programming rates of slow and fast memory cells are substantially the same. In contrast, with conventional programming operations that use the same incrementally increasing programming voltages for all memory cells, the difference between the programmed threshold voltages of fast and slow memory cells continues to diverge or widen throughout the programming process, and programming of slow memory cells takes much longer than programming of fast memory cells. Therefore, with conventional programming techniques, the divergence programming times between fast and slow memory cells generally becomes worse for higher target threshold voltage levels.

The write operation of FIG. 3A for each selected memory cell can be considered to include a series of one or more programming sequences. Within each programming sequence, the memory cell is programmed and verified to have reached a corresponding predetermined or target threshold voltage. The first programming sequence, for example, is targeted for the first or lowest predetermined voltage or target threshold voltage, while the last programming sequence is targeted for the last or highest target threshold voltage. Memory cells being programmed to the highest target threshold voltage go through all of the programming sequences consecutively, starting with the first programming sequence. Memory cells being programmed to lower target threshold voltages only require one or some of the programming sequences.

Figure 3B:
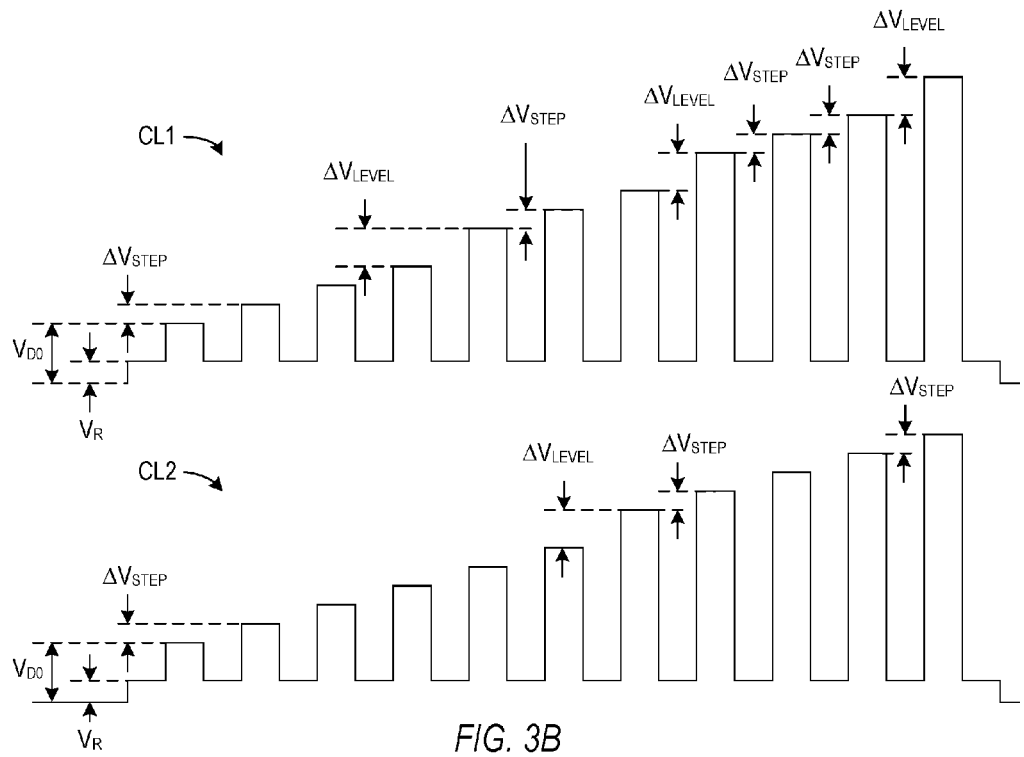

FIG. 3B shows an alternative embodiment of the invention in which the adaptive write operation intelligently increments the drain voltage associated with each of the selected memory cells along a selected word line in a similar manner to the incrementing of the gate voltage waveforms shown in FIG. 3A. The word line programming voltage for each programming sequence in the write operation can be either the same or different. Changing the drain voltage as shown in FIG. 3B is useful for non-volatile memories with a common word line array architecture and a predictable programmed threshold voltage dependency on drain voltage including architectures using bi-directional, nitride-based, localized charge trapping memory cells, which rely on Channel Hot Electron (CHE) injection for the write operation.

NAND Flash memories, which rely on Fowler-Nordheim (FN) tunneling for the write operation, also show a predictable dependence on drain voltage. Therefore, programming of NAND Flash memories can also use an adaptive method similar to that shown in FIG. 3B, except that the timing may need to be extended, drain voltage waveforms (CL1 and CL2) and polarities of voltage step $\Delta V_{STEP}$ and level jump voltage $\Delta V_{LEVEL}$ may also need to be changed in order to suit the FN tunneling characteristics. For example, drain voltage for a NAND Flash memory cell could start at a slightly positive voltage level during the early programming sequences of the write operation and decreases in voltage as programming progresses, so that voltage step $\Delta V_{STEP}$ and level jump voltage $\Delta V_{LEVEL}$ would be negative values. This method can effectively control the electric field across the tunnel oxide (and tunneling current) to be about constant during the write operation so as to achieve good programmed threshold voltage resolution across the entire threshold voltage dynamic range.

Figure 4A:
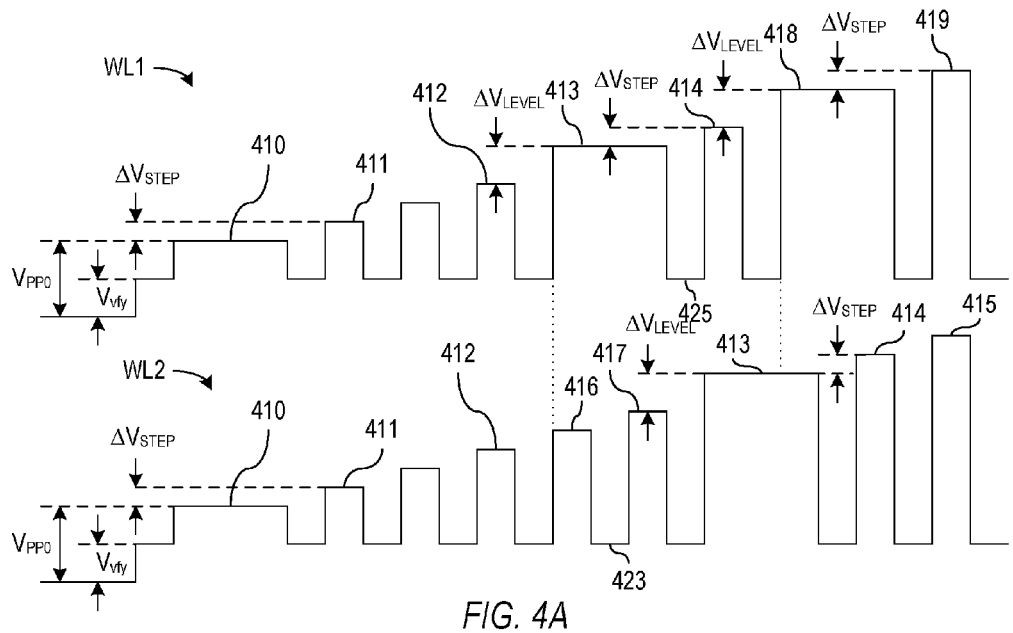
FIGS. 4A, 4B, 4C, 4D, and 4E show timing diagrams of applied programming signals during adaptive programming operations in accordance with alternative embodiments of the invention using variable program pulse widths.

FIG. 4A illustrates waveforms for word line signals WL1 and WL2 for an alternative embodiment of an adaptive write operation in accordance with the invention. The write operation of FIG. 4A illustrates the use of program pulses with variable duration. In particular, an initial program pulse 410 and program pulses 413 and 418 that are after larger level jumps ($\Delta V_{LEVEL}$) in the word line signals WL1 and WL2 can be longer relative to other program pulses 411 to 412, 416 to 417, 414 to 415, and 419. The relatively long program pulses 410, 413, and 418 (e.g., with program pulse width of about 1 microsecond or longer) provide more time for the threshold voltages of the selected memory cells to reach "saturation" threshold voltages corresponding to the applied programming voltages. This effectively ensures that subsequent c threshold voltage changes $\Delta Vt$ thereafter would be limited by corresponding word-line voltage steps $\Delta V_{STEP}$, resulting in the programmed threshold voltage resolution being equal to or less than $\Delta V_{STEP}$. In particular, a specific selection of word line, column line programming voltages, and program pulse width provides a corresponding final "saturation" threshold voltage that depends on the intrinsic characteristics or property of a floating-gate memory cell, but generally does not have a strong dependence on whether the memory cell is a fast or slow programming memory cell. For a given applied programming voltage, programming is fastest when the selected memory cell has a threshold voltage that is far from the "saturation" threshold voltage, and programming is slowest as the threshold voltage approaches its "saturated" threshold voltage. Relatively long program pulses 410, 413, and 418 provide more time for the selected memory cells to reach their "saturation" threshold voltages corresponding to the applied programming voltages. Slow programming memory cells will generally be slower to reach their "saturation" threshold voltages compared to fast programming memory cells. Therefore, the relatively long program pulses 410, 413, and 418 typically allow more time for the slow memory cells to reach their "saturation" threshold voltages. The pulse widths of program pulses 410, 413, and 418 are preferably selected such that the slow programming cells reach their "saturation" threshold voltages near the end of the relatively long program pulses. Additionally, the word line programming voltages for long program pulses 410, 413, and 418 are preferably selected such that the corresponding "saturation" threshold voltages are about equal to or lower than the corresponding predetermined or target threshold voltages, so that the fast memory cells do not overshoot their predetermined or target threshold voltages.

Applied programming voltages for program pulse 410 may be selected so that a fast memory cell has a corresponding "saturation" threshold voltage that is less than the first predetermined voltage $V_{CP1}$. Normal or relatively short program pulses 411 to 412 following a relatively long program pulse 410 ideally provide the threshold voltage increases $\Delta Vt$ that are about equal or proportional to step voltage $\Delta V_{STEP}$, since the memory cells would have reached their "saturation" threshold voltages corresponding to the applied programming voltages during the long program pulse 410. As mentioned earlier, the change $\Delta Vt$ in threshold voltage per program pulse being equal or proportional to the change $\Delta Vpp$ in word line voltage or step voltage $\Delta V_{STEP}$ is an intrinsic characteristics or property of a typical flash memory cell. Accordingly, the number of program pulses following the relatively long program pulse 410 required to raise the threshold voltage of a selected memory cell to the next predetermined voltage depends on the "saturation" threshold voltage of the memory cell corresponding to the applied programming voltages during the relatively long program pulse 410. The number N of normal or relatively short program pulses with incrementally increasing word line voltage steps ($\Delta Vpp=\Delta V_{STEP}$) following a relatively long program pulse with increased word line voltage step ($\Delta Vpp=\Delta V_{LEVEL}$) can be approximated by the following formula:

$$N = \text{(Difference between consecutive predetermined voltages} - \Delta V_{LEVEL}) \div \Delta V_{STEP}$$

A relatively long program pulse 413 or 418 is used after the larger level jump $\Delta V_{LEVEL}$ to again allow more time for the memory cells to reach their "saturation" threshold voltages corresponding to the new higher applied programming voltages. The larger level jumps $\Delta V_{LEVEL}$ in the word line programming voltage reduce the write time by effectively reducing the number of program cycles with smaller incremental jumps $\Delta V_{STEP}$. The relatively long program pulses 410, 413, and 418 also reduce the write time by effectively reducing the number of verify operations when the threshold voltages of the selected memory cells are not close to the predetermined voltages, but the use of relatively short program pulses with smaller voltage steps $\Delta V_{STEP}$ limits or controls the threshold voltage changes $\Delta Vt$ when the threshold voltages of the selected memory cells near or approach a predetermined voltage. Voltage step $\Delta V_{STEP}$ and level jump voltage $\Delta V_{LEVEL}$ are preferably set to equal to or less than the programmed threshold voltage resolution target and the difference between the consecutive predetermined voltages, respectively.

In FIG. 4A, since a fast memory cell associated with applied word line voltage WL1 reaches the first predetermined voltage faster than the slow memory cell associated with applied word line voltage WL2, the fast memory cell uses a relatively long program pulse 413 with large $\Delta V_{LEVEL}$ step while the slow memory cell in WL2 is still using normal or relatively short program pulses 416 to 417 with small voltage steps $\Delta V_{STEP}$. Therefore, the relatively long and normal or relatively short program pulse sequences are not synchronized between the fast and slow memory cells. For example, while the slow memory cell is being verified in verify operation 423 between program pulses 416 and 417, the fast memory cell is being programmed in relatively long program pulse 413. As mentioned earlier, program and verify operations for a number of memory cells, which potentially include both fast and slow memory cells, are usually required to be performed at the same time similar to a read operation. Hence, the write scheme shown in FIG. 4A is generally more suitable for sequential program and verify operations.

Figure 4B:
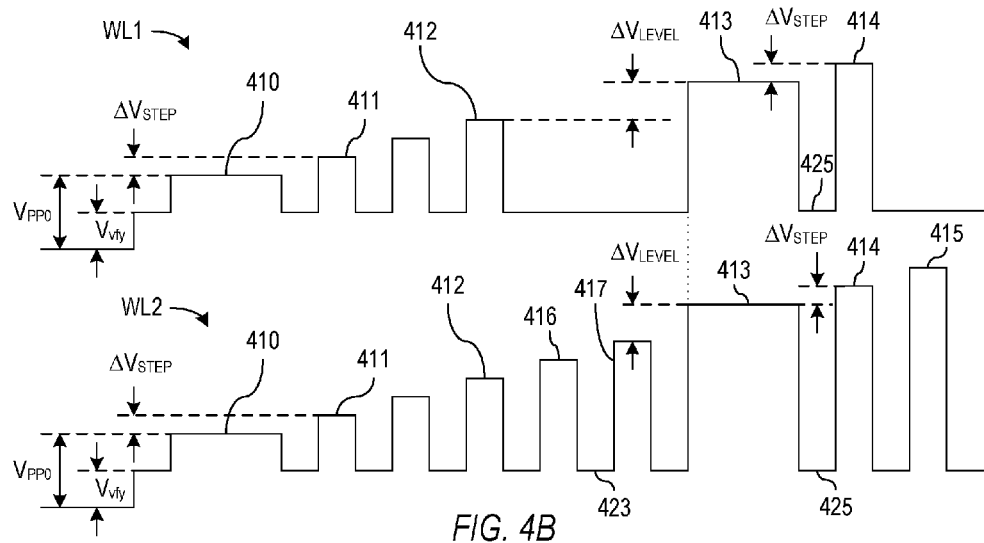

FIG. 4B shows another embodiment of the adaptive write scheme that is similar to the write operation described in FIG. 4A but is more suitable for memory performing parallel program and verify operations. In the write operation of FIG. 4B, after the fast memory cell with applied word line signal WL1 has reached the first predetermined voltage further programming is delayed or suspended, instead of immediately applying a relatively long program pulse 413 with an added level jump voltage $\Delta V_{LEVEL}$. As shown, the application of the relatively long program pulse 413 for the fast memory cell is delayed until the slow memory cell with applied word line voltage WL2 is ready for a relatively long program pulse with a level jump $\Delta V_{LEVEL}$. As a result, the relatively long program pulse 413 as well as the subsequent verify operation 425 and program pulse 414 for both the fast and slow memory cells are aligned or synchronized, thereby allowing program and verify operations for a number of memory cells to occur simultaneously. Also, during each verify operation, all selected memory cells are verified with selected reference cells which have the same threshold voltages pre-set to the same predetermined voltages. With this write scheme, both fast and slow memory cells reach the same predetermined voltages before being programmed to the next higher predetermined voltages. It should be noted however, that the slow programming memory cells have higher applied programming voltages during the write operation beginning with program pulse 413, which tends to equalize the speed at which fast and slow memory cells are programmed and prevents the write operation from being significantly slowed.

Figure 4C:
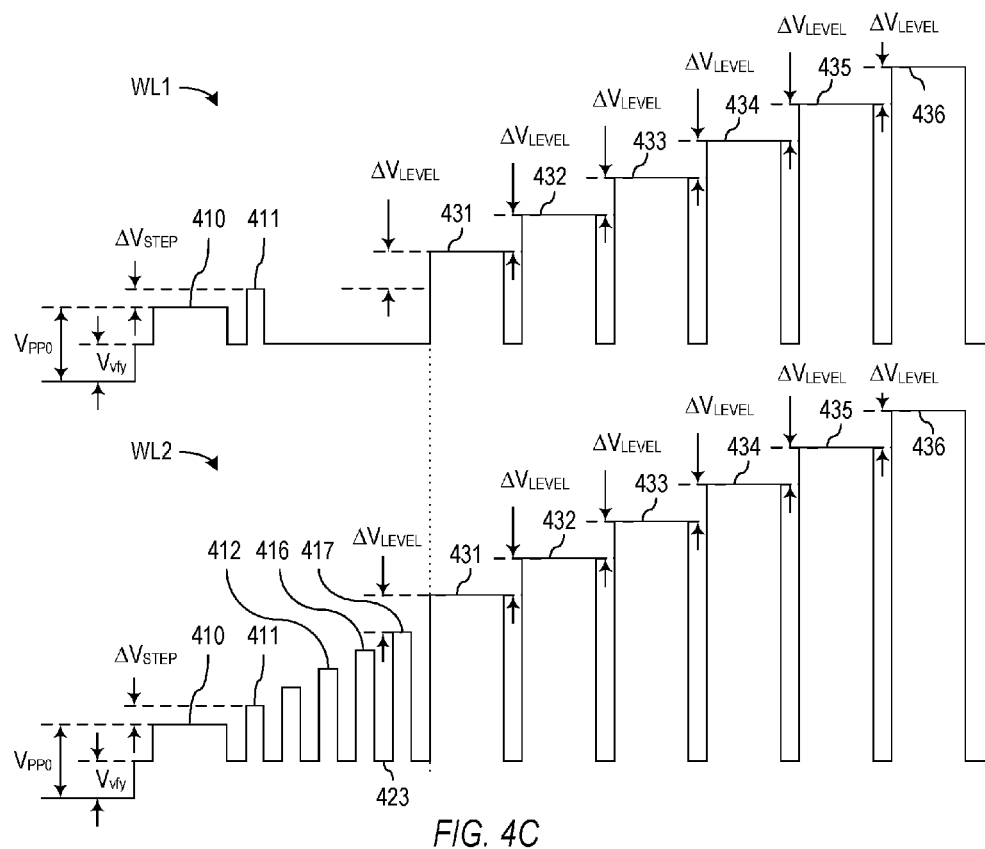

FIG. 4C shows another example of a portion of a write operation for fast and slow memory cells having applied word line voltages WL1 and WL2, respectively. The write operation of FIG. 4C uses an initial programming sequence or sequences during which fast and slow memory cells are programmed to one or more predetermined threshold voltage levels. During these initial programming sequences, the applied programming voltages for the slow memory cell become greater than the applied programming voltages for the fast memory cells. The initial programming sequence or sequences thus equalize the programming rate for fast and slow memory cells. Once the programming rate of the slow memory cell catches up with that of the fast memory cell, the subsequent program pulses 431, 432, 433, 434, 435, and 436 for the slow memory cell in WL2 are identical to the fast memory cells in WL1, except for the word line voltage Vpp which is higher because of the additional voltage steps $\Delta V step$ during the initial programming sequence or sequences. For the subsequent programming sequences, FIG. 4C illustrates use of only a single initial relatively long program pulses to reach the subsequent predetermined voltages. This is possible because both the fast and slow memory cells have already reached their "saturated" threshold voltage corresponding to their applied programming voltages. Alternatively, program pulses after the first programming sequence can use normal or relatively short pulse width as used by program pulses 411 to 412, 416, and 417 in the first programming sequence.

Figure 4D:
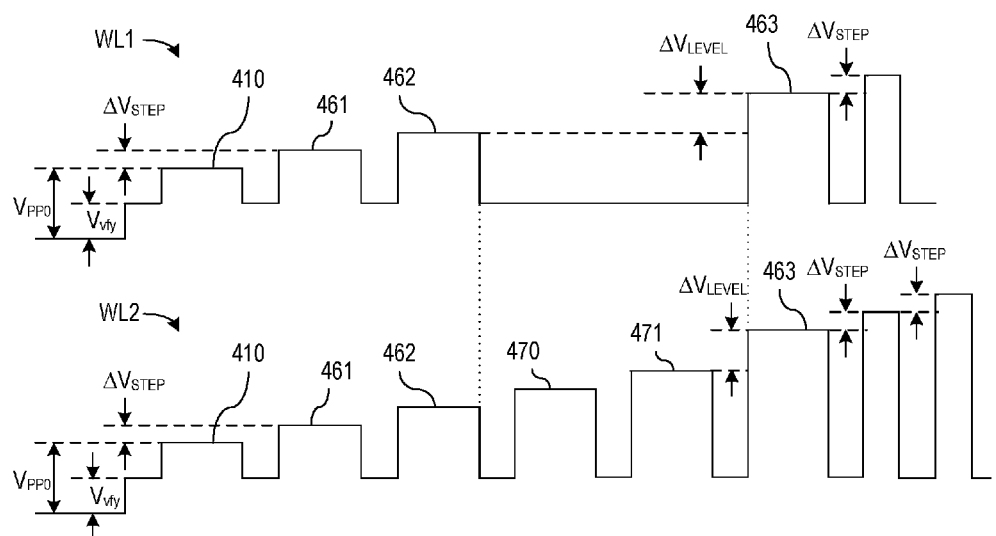

FIG. 4D shows an embodiment of a portion of a write operation using program pulses 410, 461, 462, 470, and 471 for programming to a first predetermined voltage that are relatively long when compared to programming pulses the following programming sequences. Afterwards, a relatively long program pulse 463 followed by normal or relatively short program pulses are used to program to subsequent predetermined voltages. However, the application of the relatively long program pulse 463 for the fast memory cell with applied word line voltage WL1 is delayed until the slow memory cell with applied word line voltage WL2 is ready for a relatively long program pulse with a large level jump voltage $\Delta V_{LEVEL}$ step. The use of relatively long program pulses initially can more quickly program the memory cells to their "saturated" threshold voltages corresponding to the applied programming voltages. Furthermore, this write operation is especially useful for slow memory cells and for situations in which the first programming voltage $V_{PP0}$ may not be set optimally.

Figure 4E:
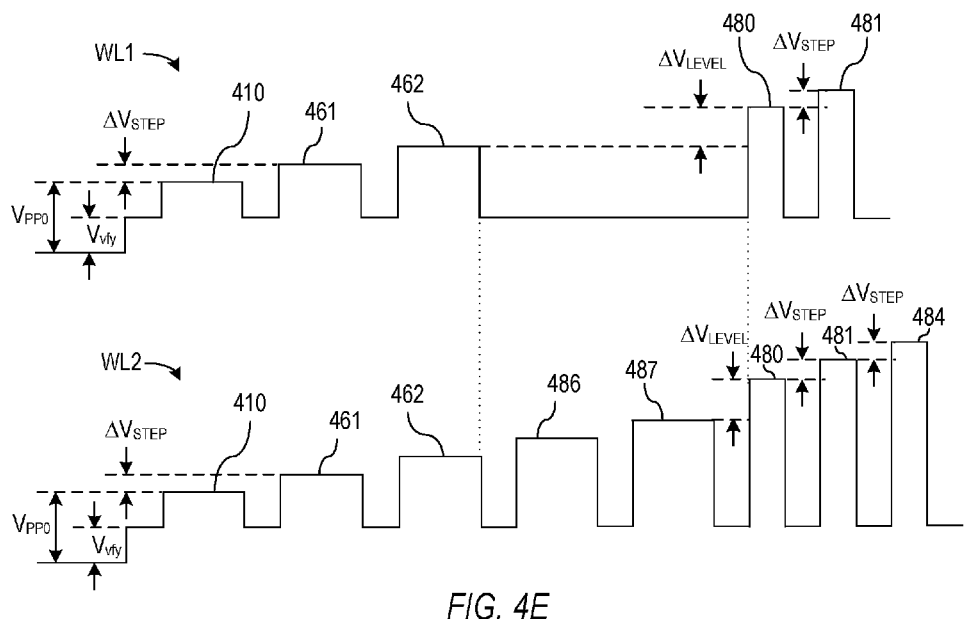

FIG. 4E shows a portion of yet another embodiment of a write operation using relatively long program pulses 410, 461, 462, 486, and 487 for programming to the first predetermined voltage. Afterwards, normal or relatively short program pulses 480, 481, 484 are used to program to the second predetermined voltage. Similar to the embodiment in FIG. 4D, the use of relatively long program pulses initially can more quickly program the memory cells to their "saturated" threshold voltages corresponding to the applied programming voltages. As a result, the use of normal or relatively short program pulses for programming to the subsequent predetermined voltages is sufficient because subsequent changes in threshold voltage will correspond to the change $\Delta Vpp$ in word line programming voltage. The use of normal or relatively short program pulses for programming to the second and subsequent predetermined voltages could help to reduce the overall write time by compensating for the longer write time used to program to the first predetermined voltage due to the use of relatively long program pulses to ensure all memory cells reach their saturated threshold voltages.

Figure 5A:
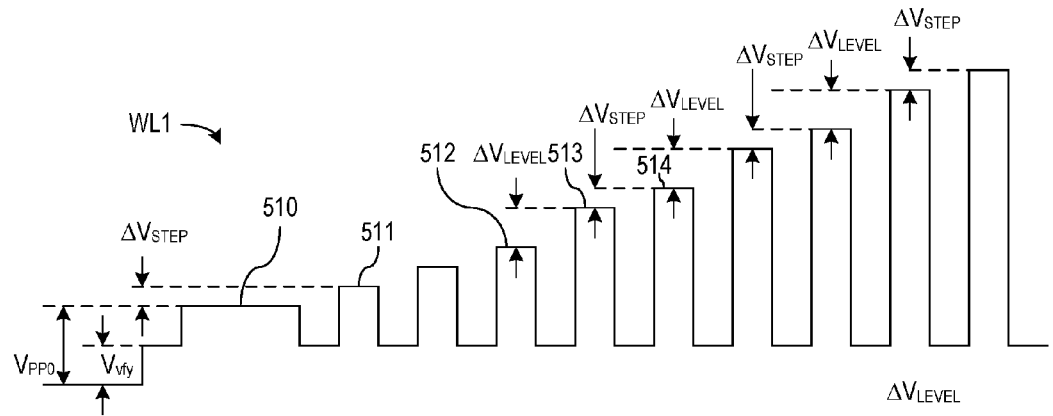
FIGS. 5A and 5B shows timing diagrams of applied programming signals during adaptive programming operations in accordance with alternative embodiments of the invention, using long/short and uniform program pulse widths, respectively.

FIG. 5A shows another embodiment of an adaptive write operation, which is suitable for parallel program and verify operations. The write operation of FIG. 5A uses a relatively long duration only for an initial program pulse 510. Subsequent program pulses such as 511 to 512, 513, 514, 516 to 517, and 518 are of relatively short duration. As a result, all programming and verify operation for both fast and slow memory cells are aligned or synchronized, thereby simplifying control of program and verify operations for a number of memory cells that occur simultaneously until the selected memory cells reach their final target threshold voltages. Unlike the programming schemes in FIGS. 4B, 4C, 4D, and 4E, the fast memory cell does not need to wait for the slow memory cell to reach the same predetermined voltages before continuing to the next predetermined voltage. The relatively long program pulse 510, e.g., with program pulse width of about 1 microsecond or longer, provides more time for the threshold voltages of the selected memory cells to reach their "saturation" threshold voltages corresponding to the applied programming voltages. This effectively ensures that subsequent changes $\Delta Vt$ in threshold voltages thereafter would be limited by corresponding changes in word-line voltages, resulting in programmed threshold voltage resolution equal to or less than step voltage $\Delta V_{STEP}$.

Figure 5B:
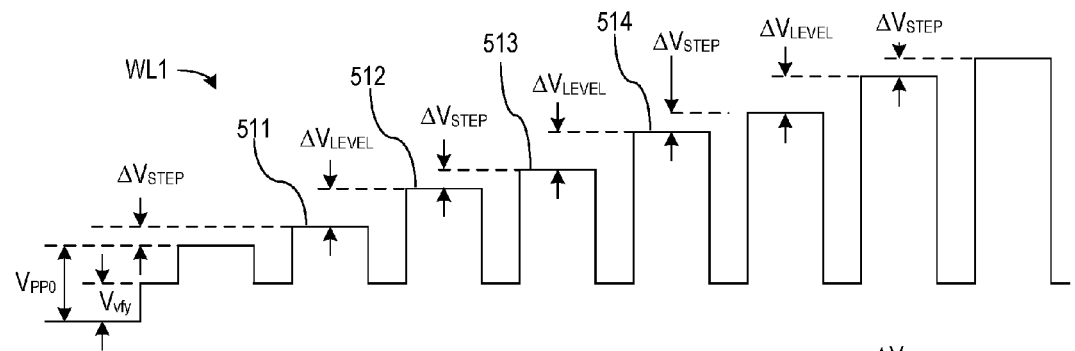

FIG. 5B shows another embodiment of an adaptive write operation, which is suitable for parallel program and verify operations. The write scheme in FIG. 5B uses a uniform and relatively long program pulse width of about 1 microsecond or longer for the initial program pulse 510 as well as subsequent program pulses 511 to 512, 513, 514, 515, 516, and 518. As a result, all programming and verify operation for both fast and slow memory cells are aligned or synchronized, thereby allowing program and verify operations for a number of memory cells to occur simultaneously. Also, the timing control logic and circuits are relatively straightforward to support uniform program pulse width. Similar to the write operation of FIG. 5A, the fast memory cell does not need to wait for the slow memory cell to reach the same predetermined voltages before continuing the write process to the next predetermined voltages.

The optimal program pulse width generally depends on a number of factors including the flash memory cell characteristics. For conventional Flash memory relying on Channel Hot Electron (CHE) injection for programming, program pulse width of about 1 microsecond or longer usually would provide sufficient time for the threshold voltages of the selected memory cells to reach their "saturation" threshold voltages corresponding to the applied programming voltages. This effectively ensures that subsequent changes $\Delta Vt$ in threshold voltages thereafter would be limited by corresponding changes ΔVpp in word line programming voltages, resulting in programmed threshold voltage resolution equal to or less than step voltage $\Delta V_{STEP}$. The use of relatively long program pulses for programming to all predetermined voltages would have the effect of unnecessarily increasing the write time for fast memory cells. However, for slow memory cells, time required for the relatively longer program pulse width is partly offset by the reduction of the number of verify operations needed to reach any given predetermined voltages.

The adaptive write operations as described above can monitor the programming performance of memory cells through measurements at predetermined voltages and control subsequently used programming parameters to achieve an optimal programming rate that provides the desired threshold voltage resolution and write times for both fast and slow memory cells. However, write operations in accordance with different embodiments of the invention can use different selections of the predetermined voltages.

Figure 6A:
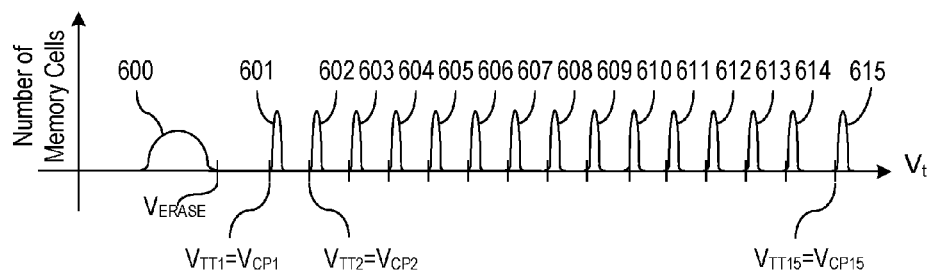
FIGS. 6A, 6B, and 6C show predetermined voltage selections, target threshold voltages, and programmed threshold voltage distributions for write operations in accordance with alternative embodiments of the invention.

In one embodiment of the invention, the predetermined voltages all correspond to target threshold voltages that represent multi-bit data values. FIG. 6A shows an example of the threshold voltage distributions 600, 601, 602, 603, 604, 605, 606, 607, 608, 609, 610, 611, 612, 613, 614, and 615 after an erase operation and write operations in a memory array storing four bits per cell. A threshold voltage $V_{ERASE}$ (e.g., about 1.5 to 3 volts) is the target voltage for an erase operation and represents one of the sixteen 4-bit data values (e.g., 1111b). Conventional erase operations generally provide a relatively wide threshold voltage distribution 600 that may be about or more than 1 volt wide.

A nearest predetermined voltage $V_{CP1}$ is sufficiently separated from threshold voltage $V_{ERASE}$ to ensure that no erased memory cells will have a threshold voltage equal or close to target threshold voltage $V_{TT1}$. Voltage $V_{CP1}$ may, for example, be about 3.25 to 3.5 volts. Using the write operation of FIG. 3A as an example, the series of normal or relatively short program pulses 310, 311, and 330, and 310 to 317 associated with word line signals WL1 and WL2, respectively, increase the threshold voltage in small voltage steps $\Delta V_{STEP}$ (e.g., of about 25 mV) so that the threshold voltage distribution 601 around target threshold voltage $V_{TT1}$ will be about as wide as voltage step $\Delta V_{STEP}$, and the threshold voltage distributions 602 to 615 at respective target voltages $V_{TT2}$ to $V_{TT15}$ have substantially the same shape and width as distribution 601.

The adaptive write operation having predetermined voltages corresponding to the target threshold voltage can effectively adjust the programming parameters for each selected cell as each target threshold voltage is reached, across the entire range of target threshold voltages. Accordingly, when programming to a highest target threshold voltage, the adaptive write operation can adapt to memory cells that may be fast-programming low in the threshold voltage range but slow-programming higher in the threshold voltage range. Similarly, the adaptive write operation can adapt to memory cells that may be slow programming at low threshold voltages but fast-programming at higher threshold voltages.

Figure 6B:
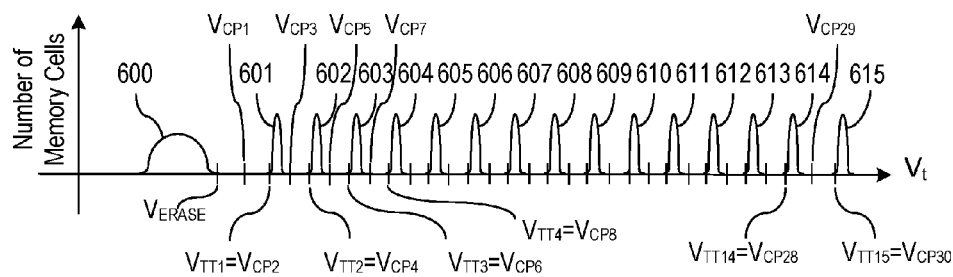

In another embodiment, predetermined voltages that are not the target threshold voltages corresponding to data can be used to improve the rate at which a write operation adapts across the entire target threshold voltage range compared to the scheme shown in FIG. 6A. FIG. 6B, for example, illustrates threshold voltage distributions where predetermined voltages $V_{CP1}$ to $V_{CP30}$ include target threshold voltages $V_{TT1}$ to $V_{TT15}$ and intermediate predetermined voltages $V_{CP1}$, $V_{CP3}$, $V_{CP5}$, $V_{CP7}$, and $V_{CP29}$, which do not represent data values and are between target threshold voltages $V_{ERASE}$ and $V_{TT1}$, $V_{TT1}$ and $V_{TT2}$, $V_{TT2}$ and $V_{TT3}$, $V_{TT3}$ and $V_{TT4}$, and $V_{TT14}$ and $V_{TT15}$, respectively. Alternative embodiments of the invention can use more than one predetermined voltages between selected target threshold voltages to maximize the rate at which the write operation adapts.

Figure 6C:
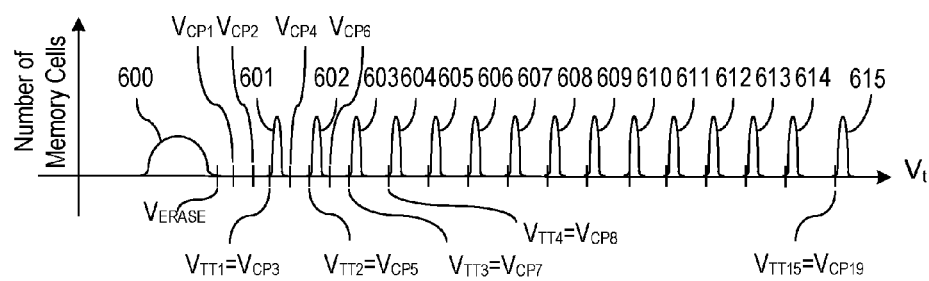

FIG. 6C illustrates an example where additional predetermined voltages lower and higher than the target threshold voltages are used early in the write operation, but all of the predetermined voltages used near the end of the write operation are equal to target threshold voltages representing data. The additional predetermined voltages $V_{CP1}$, $V_{CP2}$, $V_{CP4}$, and $V_{CP6}$ are particularly useful early in the write operation or at lower threshold voltages because a selected memory cell that reaches the first predetermined voltage $V_{CP1}$ after a small number of program pulses may do so either due to the memory cell programming quickly or the erased threshold voltage of the memory cell starting at the high end of distribution 600. However, for a given memory cell and programming voltage, a lower erased or starting threshold voltage typically has a higher initial programming rate than a higher erased or starting threshold voltage. For a slow memory cell, the additional predetermined voltages early in the write cycle or at a lower threshold voltage range would help to speed up the entire write operation by rapidly adjusting the programming voltage higher during the early stages of the write operation. Also, different memory cells including fast and slow memory cells typically require different programming times to reach their respective saturated threshold voltages corresponding to their applied programming voltages. A long initial program pulse such as those shown in FIGS. 4A, 4B, 4C, 4D, 4E, 5A, and 5B helps reduce the effect of the width of erase voltage distribution 600 by driving the selected memory cells to threshold voltages that depend on the programming speed of the memory cell rather than the initial erased threshold voltage of the selected memory cell. Even so, the number of program pulses required to reach the first predetermined voltage may not accurately indicate the programming speed of the selected memory cells when the memory cells do not start with the same threshold voltage. Therefore, additional predetermined voltages between target threshold voltages early in the write cycle or lower in the threshold voltage range can be useful.

Figure 7:
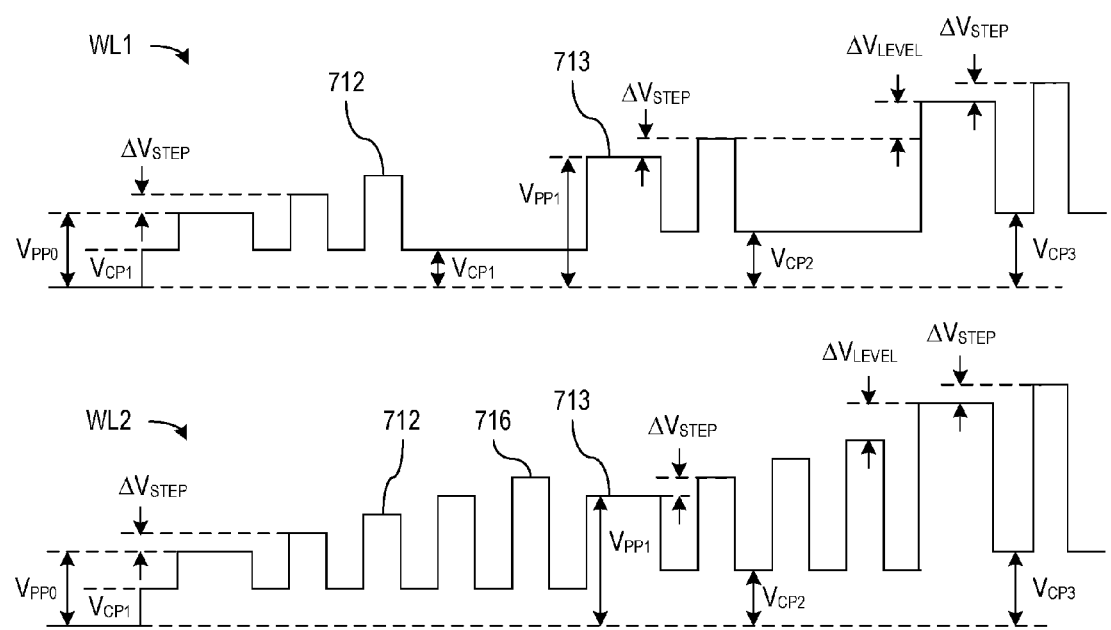
FIG. 7 shows timing diagrams for a write operation in accordance with an embodiment of the invention that begins adaptive programming after removing variations in the initial threshold voltages of the selected memory cells.

Theoretically, the threshold of the selected memory cells will normally be within a narrow distribution (e.g., ±25 mV) after reaching the first predetermined voltage. In accordance with a further aspect of the invention, each selected memory cell may begin adaptive programming after initial program pulses have programmed the selected memory cell to within a narrow tolerance of the first and second predetermined voltages $V_{CP1}$ and $V_{CP2}$. FIG. 7 illustrates the waveforms for local word line signals WL1 and WL2 for fast and slow memory cells, respectively, during an adaptive write operation in accordance with an embodiment of the invention that begins adaptive programming only after narrowing the effective threshold voltage distribution twice—during programming to the first and second predetermined voltages $V_{CP1}$ and $V_{CP2}$. In this embodiment, a word line programming voltage $V_{PP1}$ in the first program pulse 713 used for programming from the first to the second predetermined voltage is fixed and may be higher than word line programming voltage $V_{PP0}$ by the difference between the first and the second predetermined voltage, e.g., $V_{CP2}-V_{CP1}$. In this embodiment, word line programming voltage $V_{PP1}$ does not depend on the programming voltages of the last program pulse 712 or 716 that raises the threshold voltage to the predetermined voltage $V_{CP1}$. This method has the advantage of ensuring the memory cells have reached their respective saturated voltages corresponding to the applied programming voltages as well as a narrow threshold voltage distribution before adaptive programming begins.

There are different ways to monitor the programming performance of selected memory cells during the course of the write operation. In one embodiment, a counter is used to monitor the number of consecutive program pulses needed to increase the threshold voltage from one predetermined voltage to the next predetermined voltage. A high or low program pulse count would therefore indicate the memory cell is slow or fast, respectively. Based on this information after each program pulse, programming parameters can be dynamically adjusted to achieve the desired write speed and programmed threshold voltage resolution.

Figure 8A:
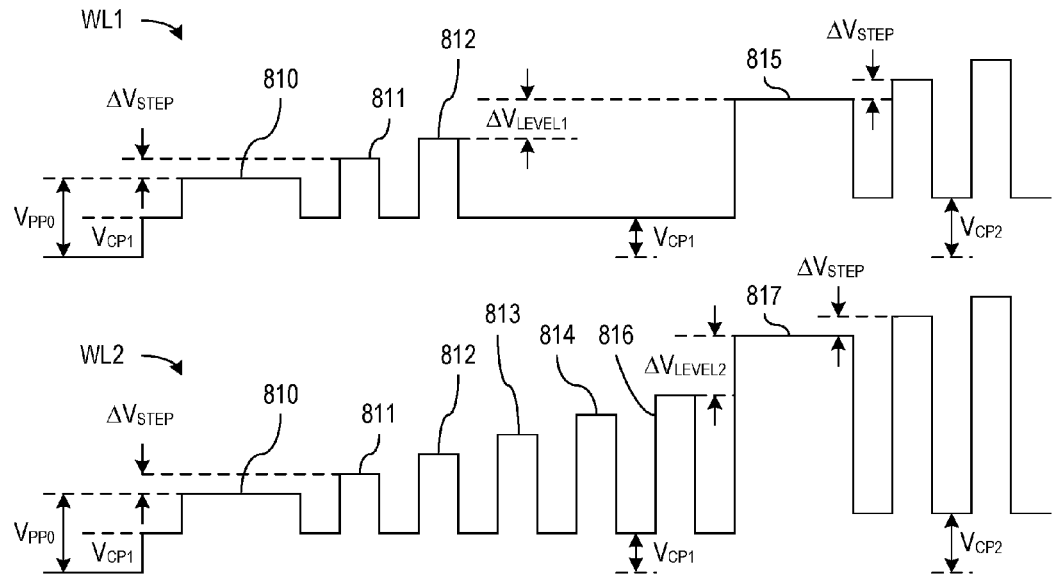
FIGS. 8A and 8B show timing diagrams for a write operation in accordance with alternative embodiments of the invention that respectively use variable level and step increments for the programming voltage.

FIG. 8A shows an embodiment in which the adaptive write operation uses non-uniform level jump voltage $\Delta V_{LEVEL}$. In particular, the level jump voltage $\Delta V_{LEVEL}$ for programming to the next higher predetermined voltages depends on the actual program pulse count needed to reach the previous predetermined voltage. As shown in FIG. 8A, the memory cell with applied word line signal WL1 requires a total of three (3) program pulses 810, 811, and 812 to reach predetermined voltage $V_{CP1}$ while the memory cell with applied word line signal WL2 requires a total of six (6) program pulses 810, 811, 812, 813, 814, and 816 to reach the same predetermined voltage $V_{CP1}$. This information indicates the memory cell with applied word line signal WL1 is a fast cell and the memory cell with applied word line signal WL2 is a slow cell; and based on this result, the programming parameters for subsequent program pulses can be adjusted accordingly to optimize programming in the next programming sequence. As shown in FIG. 8A, the faster memory cell uses a smaller voltage increment $\Delta V_{LEVEL1}$ for the initial program pulse 815 in the second programming sequence; whereas, the slower memory cell uses a larger voltage increment $\Delta V_{LEVEL2}$ for the initial program pulse 817 in the second programming sequence. This method can effectively reduce differences in programming speed and programming characteristics among fast and slow memory cells. Alternatively, program pulse width for program pulses 815 and 817 can have the same pulse width as program pulses 811, 812, 813, 814, and 816.

Figure 8B:
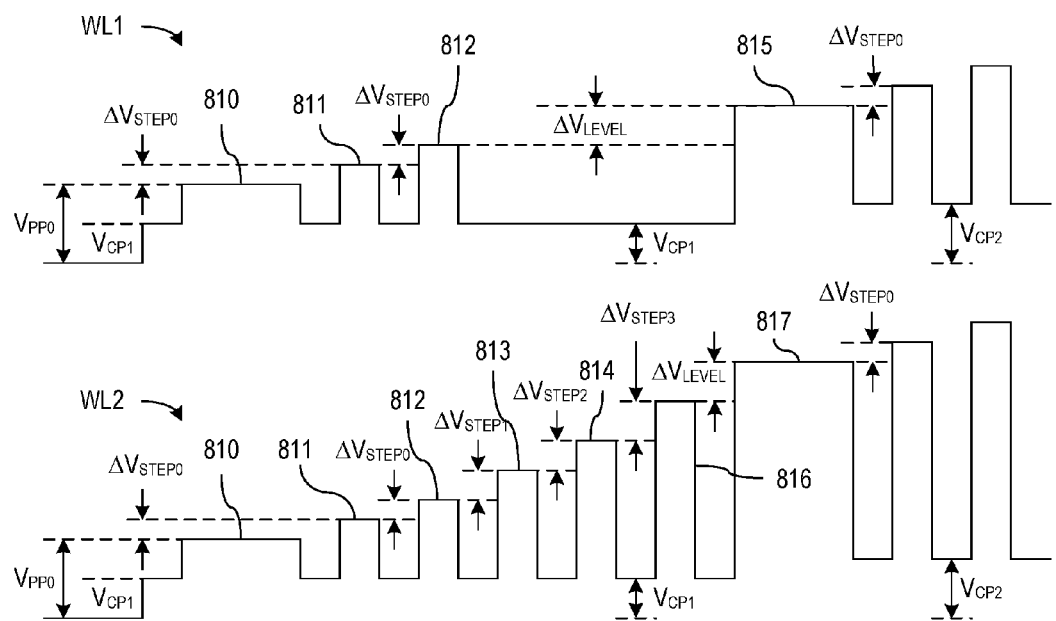

FIG. 8B shows an embodiment in which the adaptive write operation is further enhanced by using non-uniform step voltage $\Delta V_{STEP}$ between consecutive program pulses in each programming sequence. For example, as shown in FIG. 8B, the fast memory cell associated with applied word line signal WL1, which requires a total of three (3) program pulses 810, 811, and 812 before reaching predetermined voltage $V_{CP1}$, use the same word line voltage step $\Delta V_{STEP0}$ between successive program pulses 810, 811, and 812. Failure of the memory cell having word line signal WL2 to reach the predetermined voltage $V_{CP1}$ after three (3) program pulses 810, 811, and 812 indicates that the memory cell may be a slow memory cell. In order to speed up programming, the word line programming voltage Vpp for the next program pulse 813 is increased over the previous program pulse 812 by a voltage step $\Delta V_{STEP1}$, which is larger than voltage step $\Delta V_{STEP0}$. When the slow memory cell fails to reach the predetermined voltage $V_{CP1}$ after the fourth program pulse 813, the word line programming voltage Vpp for the next program pulse 814 is increased over the previous program pulse 813 by a voltage step $\Delta V_{STEP2}$, which is larger than voltage step $\Delta V_{STEP1}$. When the slow memory cell still fails to reach the predetermined voltage $V_{CP1}$ after the fifth program pulse 814, the word line programming voltage Vpp of the next program pulse 816 is increased over the previous program pulse 814 by a voltage step $\Delta V_{STEP3}$, which is larger than voltage step $\Delta V_{STEP2}$. As a result, the word line programming voltage Vpp can be progressively adjusted higher to speed up programming of a slow memory cell.

The example shown in FIG. 8B uses a total of three (3) program pulses in the first sequence before determining whether the memory cell is fast or slow. Alternatively, the number N of program pulses used to determine whether a memory cell is fast or slow in each programming sequence, could be one (1), two (2), three (3), four (4) or more; and the number N could be the same or different across all programming sequences or predetermined voltages. As a result, the word line programming voltage Vpp could be continuously and adaptively adjusted to compensate for the differences in programming speed and programming characteristics among fast and slow memory cells in each programming sequence.

Figure 9:
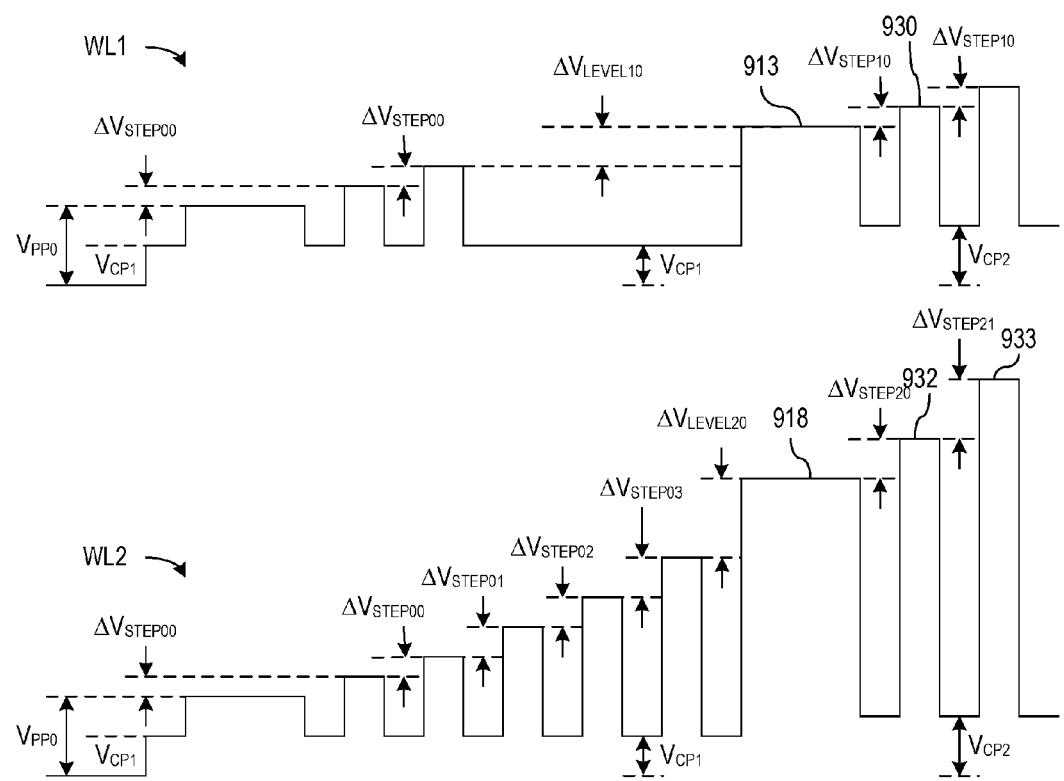
FIG. 9 shows timing diagrams for a write operation in accordance with an embodiment of the invention that uses both variable level and step increments for the programming voltage.

In accordance with another embodiment of the invention, program pulse counts to reach any predetermined voltages could be stored, and later applied to adjust any or all of the programming parameters in any programming sequences. For example, as shown in FIG. 9, the memory cells having applied word line signals WL1 and WL2 are determined to be fast and slow memory cells, respectively, after a predetermined number of program pulses in the first programming sequence, which is 3 in this example. Voltage increments $\Delta V_{STEP10}$ and $\Delta V_{STEP20}$, which are used for determining the word line programming voltages for program pulses 930 and 932 in the second programming sequence, could be selected according to the respective program pulse counts in respective first programming sequence. Increments $\Delta V_{STEP20}$ and $\Delta V_{STEP21}$ could be larger, equal to, or smaller than $\Delta V_{STEP01}$ and $\Delta V_{STEP02}$ in the second programming sequence. Similarly, the increments could also be adjusted differently for program pulses at the beginning of each programming sequence depending on the actual program pulse count from the previous programming sequence. For example, FIG. 9 shows program pulse 918 for the slow memory cell uses voltage step $\Delta V_{LEVEL20}$, which is larger than voltage step $\Delta V_{LEVEL10}$ for program pulse 913 for the fast memory cell.

Verify operations in FIGS. 7, 8A, 8B, and 9 do not use a fixed verify word line voltage $V_{VFY}$, which is used by the verify operations shown in FIGS. 3A, 4A, 4B, 4C, 4D, 4E, 5A, and 5B. Instead, the verify word line voltages shown in FIGS. 7, 8A, 8B, and 9 vary in each programming sequence according to the predetermined voltage to which the memory cells are being programmed during the programming sequence. As will be described later, both verify schemes are capable of verifying whether the memory cells have reached the predetermined voltages or target threshold voltages. Therefore, the write operations of FIGS. 7, 8A, 8B, and 9 could alternatively employ a verify scheme using fixed verify word line voltage $V_{VFY}$.

The embodiments of the inventions shown in FIGS. 3A, 4A, 4B, 4C, 4D, 4E, 5A, 5B, 7, 8A, 8B, and 9 can provide continuous, adaptive adjustments to all programming parameters, not just limited to the word line programming voltage. In fact, for any non-volatile memory technology, any applied programming voltage or programming parameter that has a predictable effect on programmed threshold voltages is a potential candidate for adaptive write operation using any or all of the methods shown in FIGS. 3A, 4A, 4B, 4C, 4D, 4E, 5A, 5B, 7, 8A, 8B, and 9. For example, program pulse width and drain voltage, which are known to have an effect on programming speed, could also be dynamically adjusted for each program pulse within each programming sequence to further enhance the adaptive write operation. In particular, program pulses used when writing to a memory cell can be adjusted to increase or decrease their duration or width depending on whether the memory cell is determined to be a fast or slow memory cell. Drain voltage associated with each of the selected memory cells along a selected word line can be adjusted in a similar manner to the incrementing of the gate voltage waveforms shown in FIGS. 3A, 4A, 4B, 4C, 4E, 5A, 5B, 7, 8A, 8B, and 9; while the word line programming voltage for each programming sequence in the write operation can be either the same or different.

Flexibility in the applied drain voltage is particularly useful for memory arrays with a continuous word line architecture, in which multiple memory cells being programmed in parallel possibly include faster and slower memory cells sharing the same word line voltage. For example, a recent technical paper published in 2002 International Solid-State Circuit Conference, titled "a 512 Mb NROM Flash Data Storage Memory with 8 MB/s Data Rate" describes a bi-directional, nitride-based, localized charge trapping memory device. This paper describes predictable programming characteristics that are dependent on drain voltage. Similarly, emerging Phase-Change Memories (PCM), which rely on joule heating to reset or set the memory cell, also show a predictable behavior in memory cell's resistance value as a function of applied drain voltage. Therefore, adaptive write operation using any or all of the methods shown in FIGS. 3A, 4A, 4B, 4C, 4D, 4E, 5A, 5B, 7, 8A, 8B, and 9 could be effectively applied to virtually all non-volatile memory technologies, regardless whether the memory array architecture is common or segmented word line, or whether the memory cell's programmed threshold voltage has a predictable dependency on gate voltage, drain voltage, or programming time.

Figure 10A:
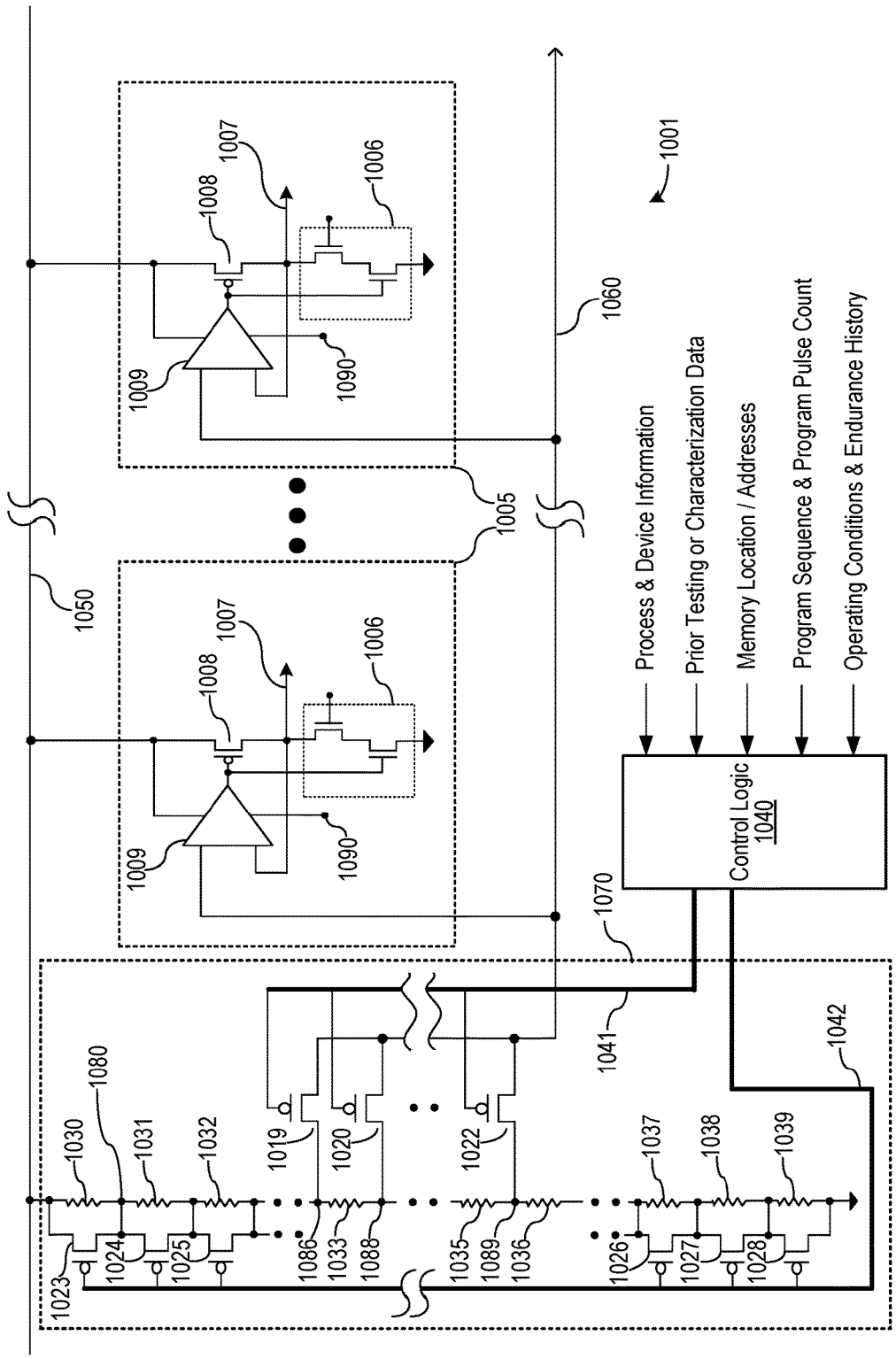
FIG. 10A illustrates an embodiment of a combined program switch and drain voltage regulator (PSDVR) capable of accurate control of the selected memory cells' drain voltages.

In order to use drain voltage variation effectively, it is important to be able to control the drain voltage accurately during each program pulse. FIG. 10A shows a combined program switch and drain voltage regulator (PSDVR) 1001, which accurately controls the drain voltage of a selected memory cell. Alternatively, a PSDVR can support more than one memory cell being programmed at the same time. However, simultaneous control of the drain voltage of multiple memory cells may require an independent "deselect" control in the column select circuit (not shown) to be activated when the corresponding memory cell has reached the predetermined voltage or target threshold voltage.

PSDVR 1001 includes a high voltage supply line 1050 that is driven by high-voltage charge pump circuitry (not shown), which may or may not have its own voltage regulator. PSDVR 1001 further includes individual voltage regulators 1005, a resistor-tree network 1070, and control logic 1040. Each voltage regulator 1005 independently supplies a programming current to a corresponding selected memory cell and is driven by a p-channel pull-up device 1008, which is gated by the output of a high-voltage unity-gain voltage follower stage 1009. One of the two inputs of the high-voltage unity-gain voltage follower stage 1009 is connected directly to an output terminal 1060 of resistor-tree network 1070, which provides a common reference voltage for voltage regulators 1005. The second input of each high-voltage unity-gain voltage follower stage 1009 is connected to an output terminal 1007 of the voltage regulator 1005 in a feedback configuration. As a result, the output voltage of voltage regulator 1005 is nearly identical to the reference voltage on resistor tree output terminal 1060. Furthermore, the output terminal 1007 of the voltage regulator 1005 is connected to a bleeder circuit 1006 and through column and bank select transistors (not shown) to drains of the memory cells. Bleeder circuit 1006 provides voltage regulator 1005 with a small leakage path to ground, which may or may not be necessary because of the inherent current path to ground via the selected memory cell. In addition, a signal 1090 to the high-voltage unity-gain voltage follower stage 1009 acts as a switch to cutoff the programming voltage and current when the selected memory cell has reached its desired target threshold voltage. For memory cells with conventional binary, 2-level storage, signal 1090 could also represent the data input.

Circuit block 1070 is a conventional resistor-tree network consisting of switching transistors 1023-1025 and 1026-1028 for controlling gross voltage adjustments, switching transistors 1019,1020,1022 for controlling fine voltage adjustments, and resistors 1030-1032, 1033-1036, and 1037-1039. The resistance values of resistors 1033-1036, which have intervening taps for voltage output, are typically lower than the resistance values of resistors 1030-1032 and 1037-1039, which can be shunted for gross voltage adjustments. The internal resistances of switching transistors 1023-1028 are relatively lower than the resistances of resistors 1030-1039. Control logic 1040 drives high-voltage bus lines 1041 and 1042 to control the switching of transistors 1019-1028 in the resistor-tree network 1070. Alternatively, low-voltage bus lines 1041 and 1042 could be used to drive low-voltage to high-voltage converters (not shown), which in turn control the switching transistors 1019-1028. The steady state reference voltage output through terminal 1060 is determined by the ratio of the resistance between the selected node along the resistor tree and supply line 1050, and between the selected node along the resistor tree and ground, similar to a voltage divider.

For gross voltage adjustments, resistors 1030-1032 and 1037-1039 are used in conjunction with switching transistors 1023-1028. For example, when transistor 1023 is turned on via bus line 1042, current from supply line 1050 primarily flows through transistor 1023 bypassing the voltage drop due to current flowing through resistor 1030. As a result, a node 1080 will have a higher voltage than if current were to only flow through resistor 1030; and output line 1060 will be pulled higher due to lower resistance path to high voltage supply line 1050. Similarly, when switching transistors 1027 and 1028 are both turned on, reference voltage on output line 1060 will be pulled lower, due to the lower resistance path to ground.

Bus line 1041 from control logic 1040 gates switching transistors 1019, 1020, and 1022, which connect output line 1060 to nodes 1086, 1088, and 1089 between resistors 1033, 1035, and 1036. Due to the relatively lower resistance values, voltage drops across resistors 1033, 1035, and 1036 are lower than the voltage drops across resistors 1030-1032 and 1037-1039. Therefore, resistors 1033, 1035, and 1036 can provide a fine voltage adjustment, while resistors 1030-1032, and 1037-1039 provide a gross voltage adjustment. Typically, control logic 1040 activates one or more switching transistors 1023-1028 in resistor-tree network 1070 to perform gross voltage adjustment, and activates one of the switching transistors 1019-1022 to perform fine voltage adjustment that provides the desired drain voltage for optimal programming. For example, when switching transistor 1019 is turned on, output line 1060 and hence the output voltage of voltage regulator 1005 will be equal to the voltage at node 1086. Therefore, by controlling the signals on 1041 and 1042, the output voltage from voltage regulator 1005 can be adjusted differently for each program pulse.

Control logic 1040 can accept a variety of input information to determine the optimal drain voltage for a program pulse. Such information includes but is not limited to process and device information, prior testing or characterization data, memory location/addresses, program sequence and program pulse count, operating conditions, and endurance history. For example, selected memory addresses can provide information to the control logic 1040 to compensate for variation in resistive effects along the programming path associated with selected memory cells located at different physical locations with respect to PSDVR 1001. For programming memory cells located near PSDVR 1001, a lower reference voltage on line 1060 and voltage on terminal 1007 can be used. In contrast, programming a memory cell located farther away from PSDVR 1001 may require a higher reference voltage on line 1060 and voltage at terminal 1007 to compensate for the increased resistive effect along the programming path to the drain of the selected memory cell.

Control logic 1040 can similarly use program sequence and program pulse count information for adaptively adjusting the drain voltage for each program pulse in each programming sequence. In particular, control logic 1040 can vary drain voltages in a manner comparable to word line voltage adjustments in adaptive write operations shown in FIGS. 3A, 4A, 4B, 4C, 4D, 4E, 5A, 5B, 7, 8A, 8B, and 9. Multi-level memories with continuous word line architectures typically program a number of selected memory cells to the same predetermined voltage or target threshold voltage during a given programming sequence. Since the program pulse count in a programming sequence effectively differentiates the programming speeds of the selected memory cells, the drain voltage can be independently adapted or adjusted for each program pulse in any programming sequence. For example, the reference voltage on line 1060 and voltage at terminal 1007 could use a nominal voltage during the first program pulse in each program sequence; and after N program pulses (where N=1, 2, 3, 4 or more), the reference voltage and voltage at terminal 1007 could gradually increase to speed up the programming of the slow memory cells, which have not yet reached the predetermined voltage of the programming sequence. The fast memory cells, which have reached the predetermined voltage, are prevented from further programming by disabling specific regulators 1005 in PSDVR 1001 upon the activation of program disable signal 1090.

Figure 10B:
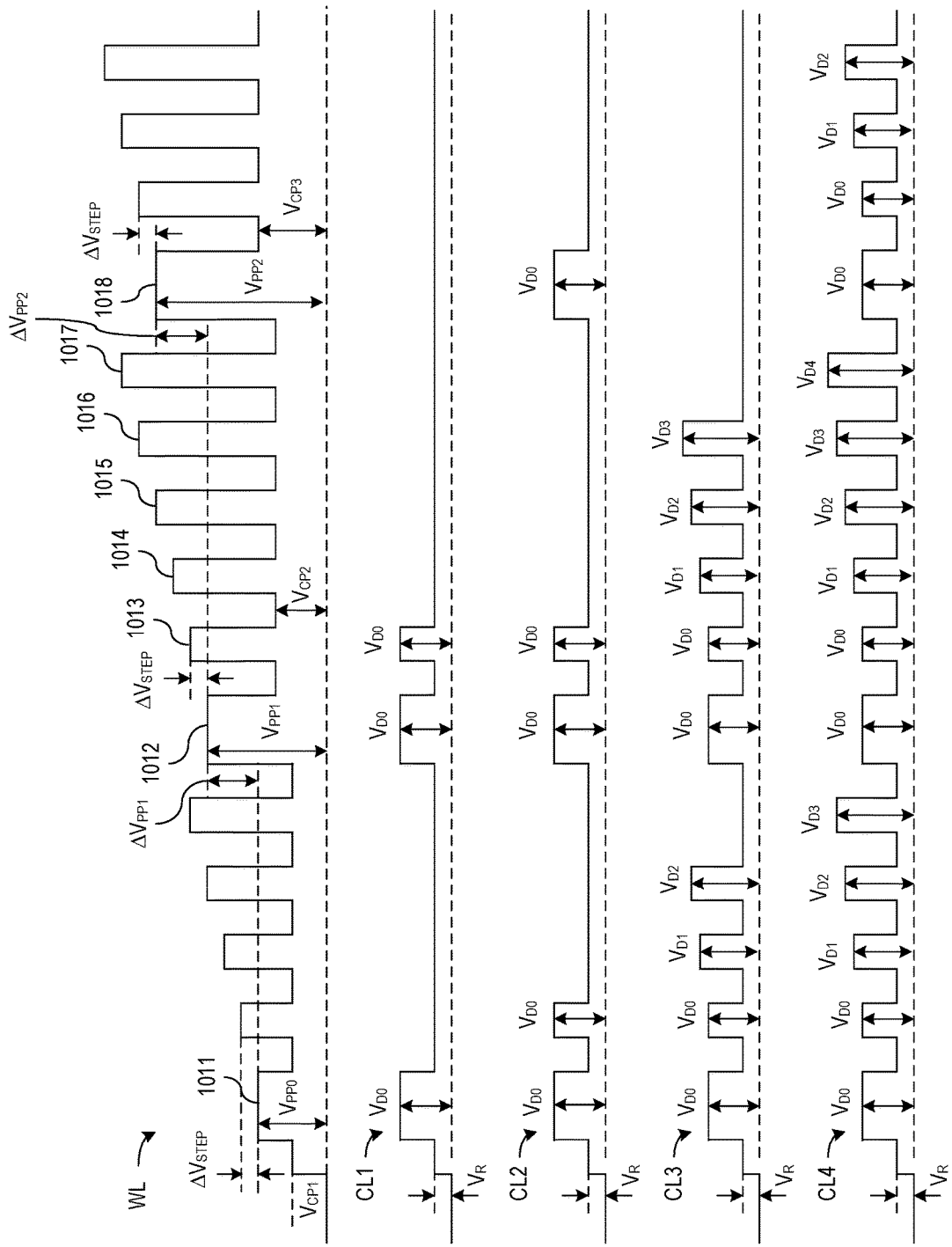
FIGS. 10B, 10C, and 10D show common word line programming voltage waveforms and drain voltage waveforms in accordance with alternative embodiments of the invention.

FIG. 10B shows a word line programming voltage waveform applied to a selected word line and four drain voltage waveforms associated with four different memory cells along the selected word line. Word line voltage increases with voltage increment $\Delta V_{STEP}$ in each of the three programming sequences program memory cells to the corresponding predetermined voltages of $V_{CP1}$, $V_{CP2}$, and $V_{CP3}$. The word line programming voltage for the first program pulses 1011, 1012, and 1018 in each of the three programming sequences are respective voltages $V_{PP0}$, $V_{PP1}$, and $V_{PP2}$; where the programming voltage differences $\Delta V_{PP1}$ or $(V_{PP1}-V_{PP0})$, and $\Delta V_{PP2}$ or $(V_{PP2}-V_{PP1})$ preferably correspond to voltage differences $(V_{CP2}-V_{CP1})$ and $(V_{CP3}-V_{CP2})$, respectively. Drain voltage waveform CL1 is indicative of a fast memory cell that requires only one program pulse 1011 in the first programming sequence with a drain voltage $V_{D0}$ to reach predetermined threshold voltage $V_{CP1}$, and two program pulses 1012 and 1013 in the second programming sequence with the same drain voltage $V_{D0}$ to reach predetermined threshold voltage $V_{CP2}$, which happens to be a target threshold voltage representing a data value. Similarly, drain voltage waveform CL2 is indicative of a fast memory cell reaching target threshold voltage $V_{CP3}$, after an additional program pulse 1018 in the third programming sequence with drain voltage $V_{D0}$. Drain voltage waveform CL4 uses the same drain voltage $V_{D0}$ for the initial two program pulses in each of the three programming sequences. However, the memory cell is determined to be a slow memory cell upon failing to reach the corresponding predetermined voltages after the initial two program pulses with drain voltage $V_{D0}$ in each of the three programming sequences. As a result, the drain voltage in subsequent program pulses is adjusted higher to speed up programming. As shown in FIG. 10B, drain voltage waveform CL4 shows the drain voltages for program pulses 1014, 1015, 1016, and 1017 in the second programming sequence are adjusted to voltages $V_{D1}$, $V_{D2}$, $V_{D3}$, and $V_{D4}$, respectively; where $V_{D4}>V_{D3}>V_{D2}>V_{D1}>V_{D0}$. Varying drain voltage in programming helps to equalize the programming rates for faster and slower memory cells, and helps to prevent fast memory cells from "overshooting" the target threshold voltage, which could result in a wide programmed voltage threshold distribution. FIG. 10B shows a word line programming voltage that uses a uniform voltage increment $\Delta V_{STEP}$ for increasing the word line voltage in each program pulse of each programming sequence. Alternatively, non-uniform voltage increments such as those shown in FIGS. 8B and 9 could also be used together with varying drain voltage to further enhance the adaptive write operation. The drain voltage waveform CL3 is indicative of a memory cell that is faster than a memory cell with drain voltage waveform CL4, but slower than the memory cells with drain voltage waveforms CL1 and CL2. The memory cell with drain voltage waveform CL3 reaches its target threshold voltage $V_{CP2}$ in the second programming sequence, so that further programming of the memory cell in the third programming sequence is not required.

Figure 10C:
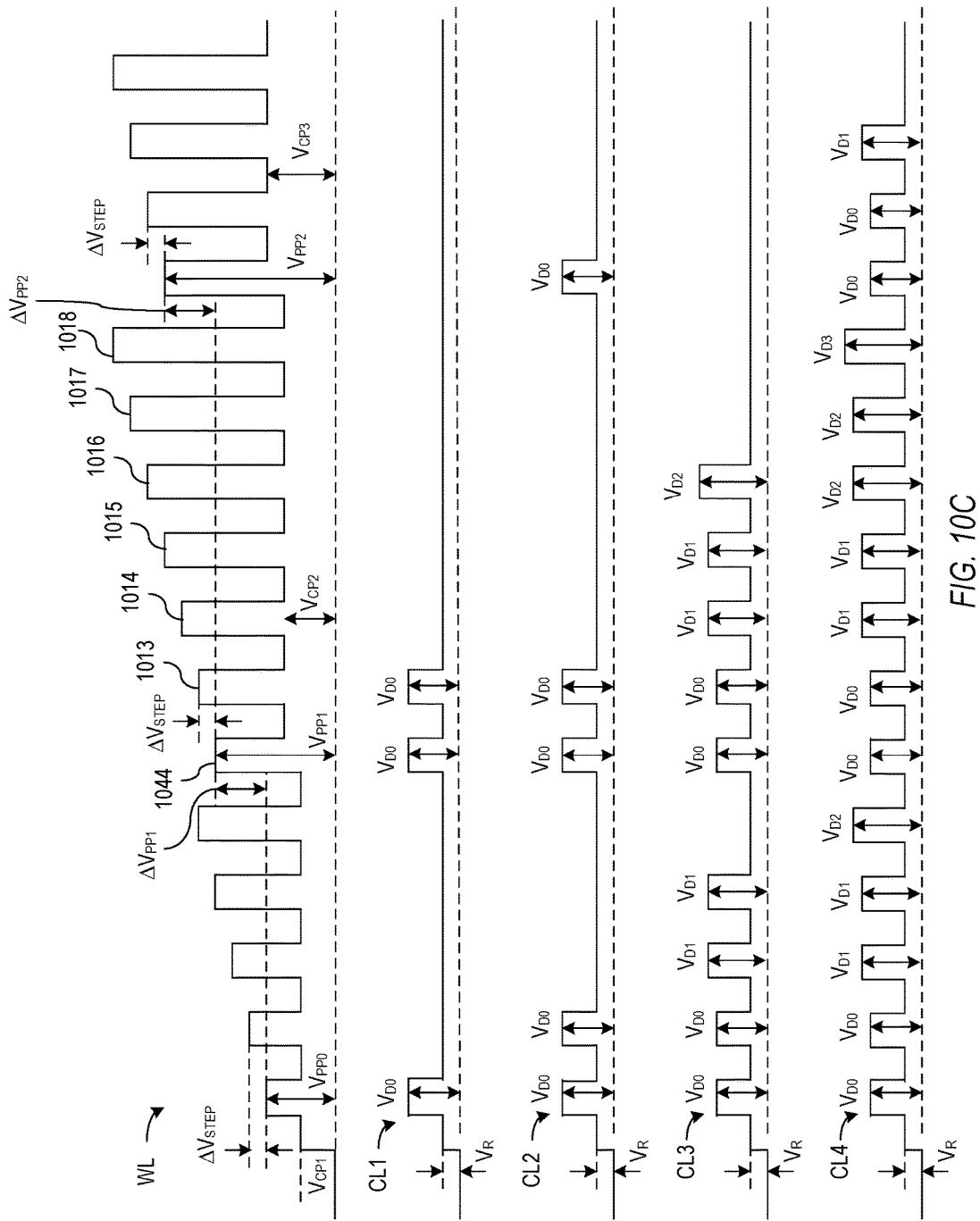

Drain voltage in each programming sequence could vary in a variety of ways, and the most suitable technique for varying the drain voltage may depend on the programming characteristics of the memory cell or the memory array. FIG. 10B shows waveforms for a write operation using a continuously-increasing drain voltage after the second program pulse in each programming sequence. Alternatively, drain voltage can increase after N number of consecutive program pulses with the same drain voltage, where N can be 0, 1, 2, 3, or more. For example, FIG. 10C shows a more gradual change in drain voltage compared to the drain voltage change shown in FIG. 10B. The voltage waveforms in FIG. 10C are similar to the voltage waveforms in FIG. 10B except for two key differences. First, program pulses shown in FIG. 10C have uniform pulse width instead of an initial long program pulse followed by normal program pulses shown in FIG. 10B. Second, the drain voltage shown in FIG. 10C increases only after two consecutive program pulses with the same drain voltage. For example, in the second programming sequence of the drain voltage waveform CL4 in FIG. 10C, the first and second program pulses 1044 and 1013 use drain voltage $V_{D0}$, the third and fourth program pulses 1014 and 1015 use drain voltage $V_{D1}$, the fifth and sixth program pulses 1016 and 1017 use drain voltage $V_{D2}$; the seventh program pulse 1018 uses drain voltage $V_{D3}$; where $V_{D3}>V_{D2}>V_{D1}>V_{D0}$. After the seventh program pulse 1018 in the illustrated example, the memory cell with drain voltage waveform CL4 has reached predetermined voltage $V_{CP2}$, terminating further programming in the second programming sequence. However, if after the seventh program pulse 1018, the memory cell with drain voltage waveform CL4 still has not reached predetermined voltage $V_{CP2}$, the eighth program pulse would have used the same drain voltage as the seventh program pulse $V_{D3}$.

Figure 10D:
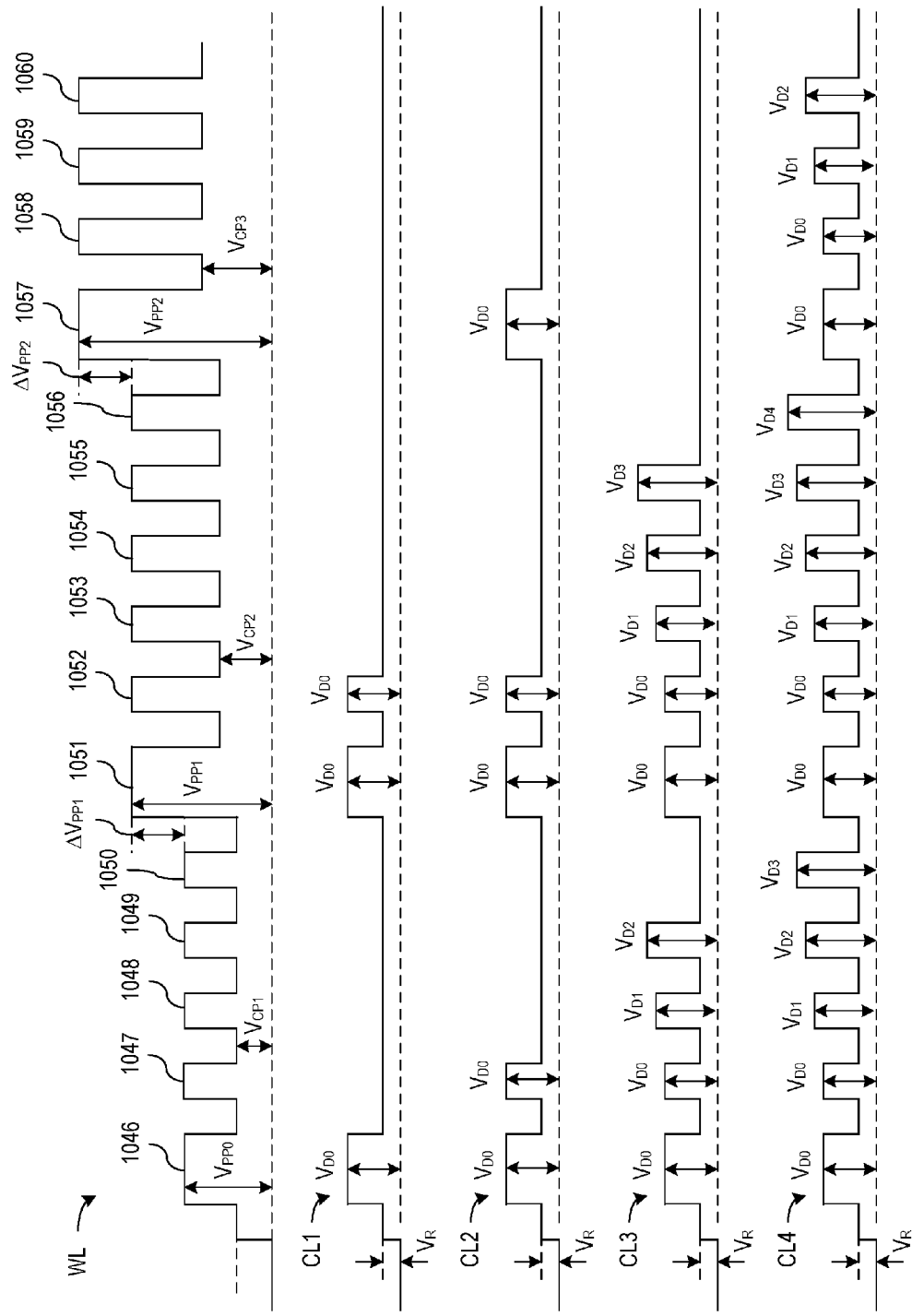

FIG. 10D shows a portion of a write operation using drain voltage waveforms that are the same as FIG. 10B but using a word line programming voltage Vpp that is constant for all program pulses within the programming sequence, instead of slowly increasing in a staircase manner. Program pulses 1046, 1047, 1048, 1049, and 1050 in the first program sequence use a word line programming voltage of $V_{PP0}$. Program pulses 1051, 1052, 1053, 1054, and 1055, and 1056 in the second program sequence use a word line programming voltage of $V_{PP1}$, and program pulses 1057, 1058, 1059, and 1060 in the third program sequence use word line programming voltage of $V_{PP2}$. In FIG. 10D, voltage differences $\Delta V_{PP1}$ or $(V_{PP1}-V_{PP0})$, and $\Delta V_{PP2}$ or $(V_{PP2}-V_{PP1})$ preferably correspond to voltage differences $(V_{CP2}-V_{CP1})$ and $(V_{CP3}-V_{CP2})$, respectively. Voltage differences $\Delta V_{PP1}$ and $\Delta V_{PP2}$ can also be determined by memory cell's programmed threshold voltage dependency on word line voltage. Using a uniform word line programming voltage is most suitable for memory cells with a predictable dependence of programmed threshold voltage on applied drain voltage when compared to applied gate voltage, for example, for bi-directional, nitride-based, localized charge trapping memory devices. Alternatively, the adaptive write operation in FIG. 10D can use uniform program pulse widths instead of an initial long program pulse followed by normal program pulses in each programming sequence.

Alternate embodiments of the inventions shown in FIGS. 10B, 10C, and 10D can use uniform, instead of non-uniform, drain voltage in program pulses of waveforms CL1, CL2, CL3, and CL4. The combination of variable gate voltage and uniform drain voltage during the write operation is most suitable for memory cells with a predictable programmed threshold voltage dependence on gate voltage.

FIGS. 10B, 10C, 10D shows predetermined voltages that are the same as target threshold voltages. Alternatively, predetermined voltages can represent both target threshold voltages as well as non-target threshold voltages, which are between target threshold voltages representing data. As a result, the number of predetermined voltages may be greater than the number of target threshold voltages.

In general, programming characteristics for all non-volatile memories are sensitive to endurance or "aging" effect. For example, NAND Flash memory cells, which rely on Fowler-Nordheim tunneling for writing, exhibit a slow degradation in programming performance after the device has gone through a large number of program and erase cycles due to accumulated charges trapped in the tunnel oxide. Therefore, control logic 1040 of FIG. 10A could use endurance history information to gradually increase the applied programming voltage based on predetermined voltage increments as the number of program and erase cycles reaches a set of predetermined values, e.g., 10,000, 50,000, 100,000, and 200,000. Unlike conventional NOR Flash memories, programming of NAND Flash memories generally relies on applying a high-voltage and near ground potential to the selected word line and selected bit lines, respectively; while unselected bit lines are biased to a high level to inhibit programming. Therefore, multi-level NAND Flash memories could essentially use the same adaptive write techniques shown in FIGS. 3A, 4A, 4B, 4C, 4D, 4E, 5A, 5B, 7, 8A, 8B, and 9. The basic PSDVR circuitry shown in FIG. 10A can also be used to generate variable word line voltage for either adaptive or non-adaptive write operations.

It will be appreciated that PSDVR 1001 with the combined function of a program switch and drain voltage regulator is capable of accurately controlling the drain voltage of the selected memory cells because it reduces the number of transistors and associated resistances connected in series along the programming path compared to the conventional approach of using separate program switch and drain voltage regulator circuits. PSDVR 1001 also uses less layout area than the conventional approach of using separate program switch and drain voltage regulator circuits.

Figure 11A:
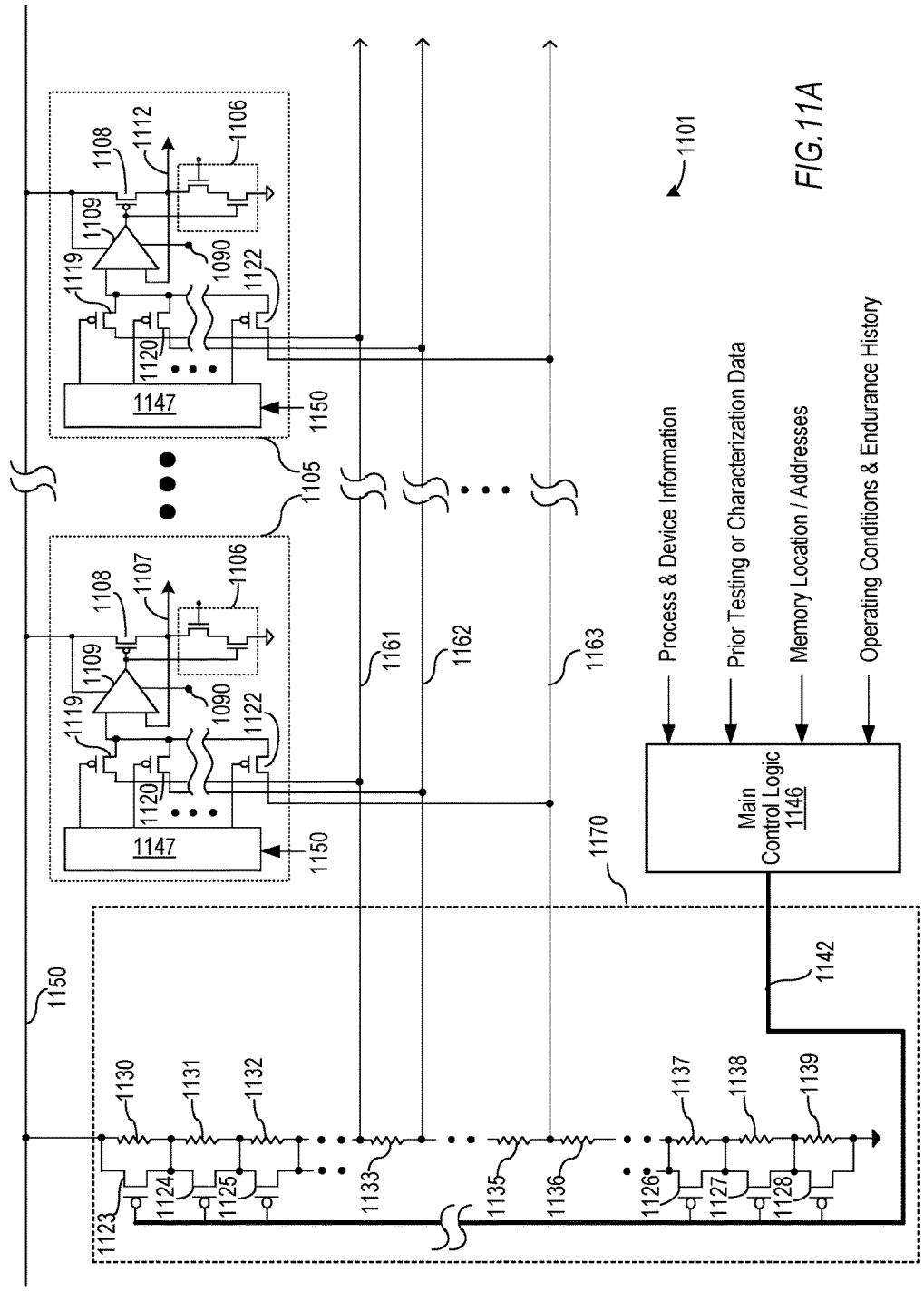
FIG. 11A illustrates an embodiment of a combined program switch and drain voltage regulator (PSDVR) capable of independent control of each selected memory cell's drain voltage.

Reference is now made to FIG. 11A, which shows another embodiment of a program switch and drain voltage regulator (PSDVR) 1101. In this embodiment, PSDVR 1101 can independently and accurately control the drain voltage supplied to each of the selected memory cells being programmed in parallel. PSDVR 1101 includes individual voltage regulators 1105, a resistor-tree network 1170, and main control logic 1146. Voltage regulators 1105, which supply programming current to selected cells, are essentially the same as the voltage regulators 1005 in FIG. 10A, except that one of the two inputs to each high-voltage unity-gain voltage follower stage 1109 is connected to different reference voltages 1161, 1162, and 1163 via corresponding switching transistors 1119, 1120, and 1122. Local control logic 1147 controls activation of switching transistors 1119, 1120, and 1122. As a result, output voltages of the voltage regulators 1105 on respective output terminals 1107 and 1112 are nearly identical to the reference voltage selected by local control logic 1147. Main control logic 1146 controls resistor tree 1170 to provide a number of reference voltages on lines 1161, 1162, and 1163 to be selectively connected to voltage regulators 1105, while PSDVR 1001 of FIG. 10A provides a common reference voltage on a single line 1060 to voltage regulators 1005.

Resistor-tree network 1170, which resembles the resistor-tree network 1070 shown in FIG. 10A, consists of a plurality of switching transistors 1123-1125 and 1126-1128 for voltage adjustments, a plurality of resistors 1130-1132, 1133-1136, and 1137-1139, where resistance values of resistors 1133-1136 could be the same as or different from the resistance values of resistors 1130-1132 and 1137-1139. Main control logic 1146 drives a bus 1142, which controls the switching transistors 1123-1128 in the resistor-tree network 1170 for voltage adjustments. Reference voltage lines 1161, 1162, and 1163 are connected directly to different nodes formed by serially connected resistors 1133, 1135, and 1136. As a result, the reference voltage on line 1161 is higher than the reference voltage on line 1162, and the reference voltage on line 1162 is higher than the reference voltage on line 1163. To enhance stability and driving capability of reference voltages 1161, 1162, and 1163, high-voltage buffers consisting of unity-gain voltage follower stages 1109, p-channel drivers 1108, and bleeders 1106 could be added between the resistor-tree and the reference voltage signals output through terminals 1107.

Bus line 1142 from main control logic 1146 gates switching transistors 1123, 1124, 1125, 1126, 1127, and 1128 for making voltage adjustments, which shifts all reference voltages on lines 1161, 1162, and 1163. Main control logic 1146 can accept a number of inputs to determine the exact voltage adjustment. The inputs to main control logic 1146 may, for example, indicate process and device information, prior testing or characterization data, memory location/addresses, operating conditions, and endurance history. Local control logic 1147 associated with each voltage regulator 1105 gates switching transistors 1119, 1120, and 1122 for selecting one of the number of reference voltages for input to the high-voltage unity-gain voltage follower stage 1109. Local control logic 1147 can select the reference voltage depending on a number of variables 1150, including but not limited to a predetermined voltage or target threshold voltage for a current programming sequence, an N-bit data value being written, where N can be 1, 2, 3, 4, or more, programming sequence count, and program pulse count. Therefore, voltage regulators 1105 can provide independent control of the drain voltage for each of the selected memory cells.

Figure 11B:
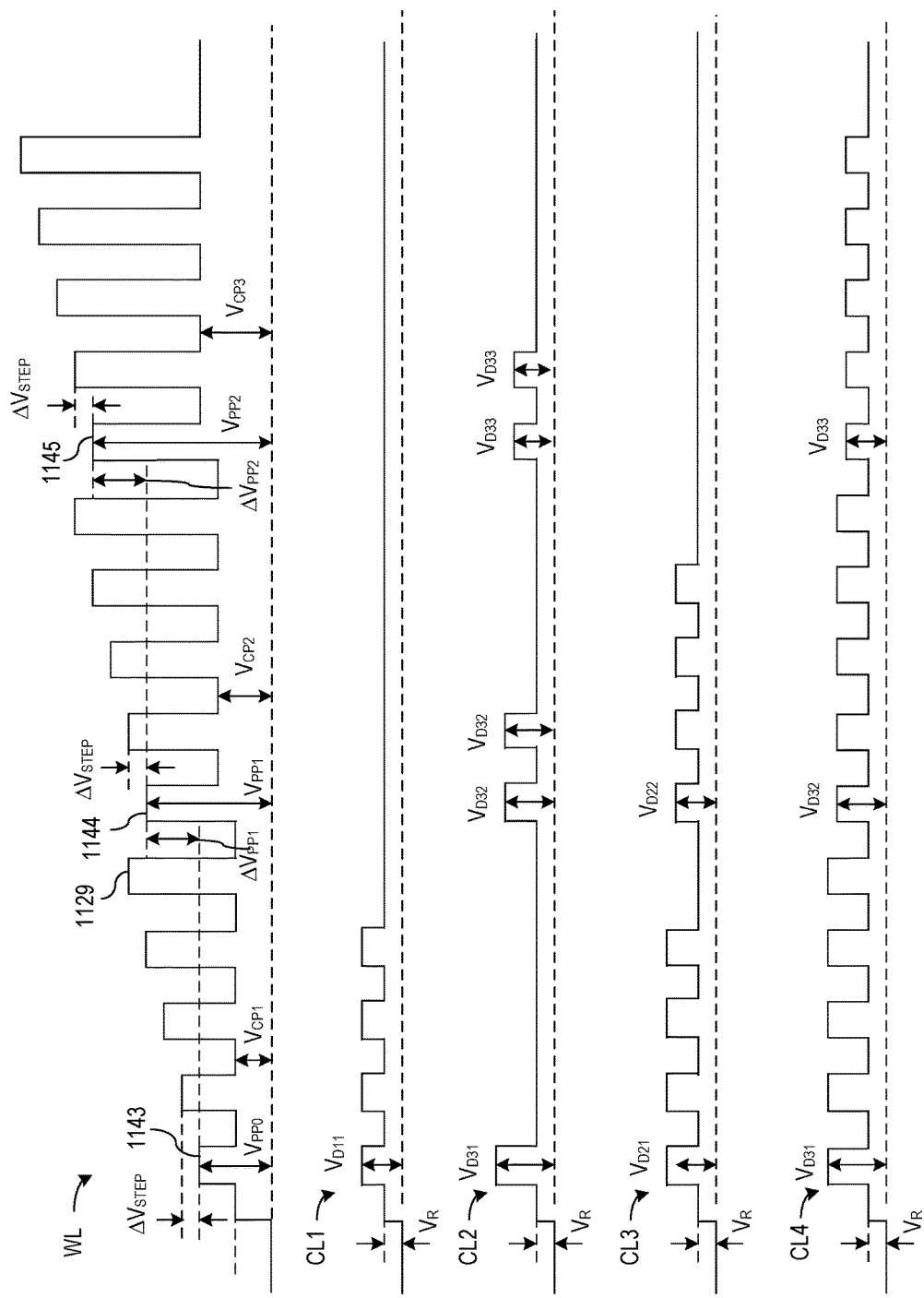
FIGS. 11B, 11C, and 11D show word line programming voltage waveforms and independently controlled drain voltage waveforms in accordance with alternative embodiments of the invention.

PSDVR 1101 in FIG. 11A can independently vary the drain voltage of each of the selected memory cells depending on target threshold voltages, program pulse counts, program sequence, and other input variables. FIG. 11B illustrates an embodiment of a write operation that can use PSDVR 1101 of FIG. 11A to generate variable drain voltages that are dependent on target threshold voltage and programming sequence. FIG. 11B particularly shows a word line programming voltage waveform for a selected word line and four drain voltage waveforms associated with four different memory cells along the selected word line. During the write operation of FIG. 11B, the word line programming voltage increases with constant voltage increment $\Delta V_{STEP}$ in each of the three programming sequences that programs memory cells to predetermined threshold voltages $V_{CP1}$, $V_{CP2}$ and $V_{CP3}$. The word line programming voltage for the first program pulses 1143, 1144, and 1145 in each of the three programming sequences are predetermined voltages $V_{PP0}$, $V_{PP1}$, and $V_{PP2}$; where voltage differences $\Delta V_{PP1}$ or $(V_{PP1}-V_{PP0})$, and $\Delta V_{PP2}$ or $(V_{PP2}-V_{PP1})$ preferably correspond to voltage differences $(V_{CP2}-V_{CP1})$ and $(V_{CP3}-V_{CP2})$, respectively. Alternatively, voltage differences $\Delta V_{PP1}$ and $\Delta V_{PP2}$ could depend on fast memory cell's programmed threshold voltage dependency on applied gate voltage. For example, if a word line programming voltage $V_{PP0}$ programs a fast memory cell from an erased threshold voltage level to the first predetermined voltage $V_{CP1}$ using a single program pulse 1143, then a word line programming voltage $V_{PP1}$ is defined as a word line programming voltage that programs that same fast memory cell from $V_{CP1}$ to $V_{CP2}$ using a single program pulse 1144 with the same pulse width as program pulse 1143. A word line programming voltage $V_{PP2}$ is defined as a word line programming voltage that programs that same fast memory cell from $V_{CP2}$ to $V_{CP3}$ using a single program pulse 1145 with the same pulse width as program pulses 1143 and 1144.

Waveforms CL1, CL2, CL3, and CL4 in FIG. 11B show the drain voltages applied to program four memory cells to target or predetermined threshold voltages $V_{CP1}$, $V_{CP3}$, $V_{CP2}$, and $V_{CP3}$, respectively. For each programming sequence, the drain voltage is determined by the selected memory cell's target threshold voltage and whether the target threshold voltage is being verified in the current programming sequence or a subsequent programming sequence. For memory cells with target threshold voltage $V_{CP1}$, which is being verified in the first programming sequence, programming accuracy is required. However, for memory cells with target threshold voltage of $V_{CP3}$, which is not being verified in the first programming sequence, absolute programming accuracy is not essential and, therefore, higher drain voltage can be used to speed up programming without the concern of overshooting the intermediary target threshold voltage $V_{CP1}$, which is far away from the target threshold voltage $V_{CP3}$. For example in FIG. 11B, drain voltage waveforms CL2 and CL4 show a drain voltage $V_{D31}$ during program pulses is higher than the drain voltage $V_{D21}$ during program pulses of waveform CL3, which in turn is higher than the drain voltage $V_{D11}$ during program pulses of waveform CL1. Moreover, drain voltages in both waveforms CL2 and CL4 decrease to voltages $V_{D32}$ and $V_{D33}$ during the second and third programming sequence, respectively, as the associated memory cells converge to the target threshold voltage $V_{CP3}$, which is being verified in the third programming sequence. Similarly, drain voltage in program pulses of waveform CL3 decreases to voltage $V_{D22}$ during the second programming sequence, as the memory cell converges to the target threshold voltage $V_{CP2}$, which is being verified in the second programming sequence. The use of higher or lower drain voltage when the threshold voltage is far away from or near the target threshold voltage, respectively; can effectively increase the write speed, but without compromising the accuracy of programmed threshold voltage. Variations in drain voltage across target threshold voltages and programming sequences are determined by programmed threshold voltage characteristics dependency on applied drain and gate voltages. Alternatively, program pulse count within a programming sequence could also be used as an input variable. For example, drain voltage in program pulses of waveforms CL1, CL2, CL3, and CL4 can vary in manners similar to the embodiments shown in FIGS. 10B, 10C, and 10D. Alternatively, program pulses shown in FIG. 11B can use non-uniform pulse widths instead of uniform pulse width.

Alternatively, the invention shown in FIG. 11B can use a uniform word line programming voltage $V_{PP0}$, $V_{PP1}$, and $V_{PP2}$ for the first, second, and third programming sequences, respectively.

Figure 11C:
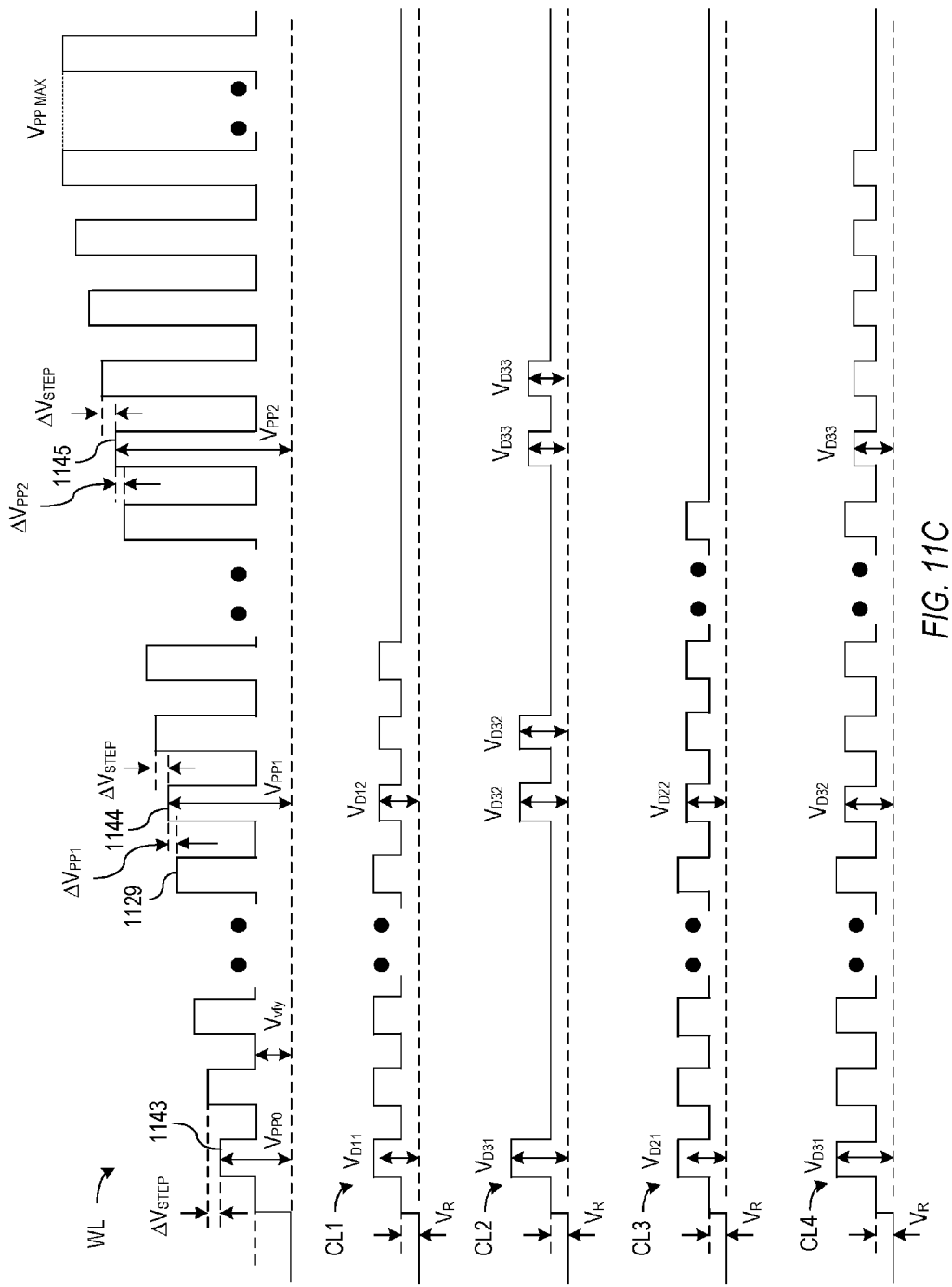

FIG. 11C shows waveforms for an adaptive write operation that allows slow memory cells, which have not yet reached the predetermined or target threshold voltages after the total program pulses in any programming sequence reach a predetermined number, to continue the write operation in subsequent programming sequences thereby permitting other memory cells with higher target threshold voltages to continue their write operations without having to wait for the slowest memory cells. For example, drain voltage waveform CL1 in FIG. 11C is for a slow memory cell that has not yet reached the target threshold voltage $V_{CP1}$ after the last program pulse 1129 in the first programming sequence. Similarly, slow memory cells associated with waveforms CL3 and CL4 have failed to reach their intermediary threshold voltage target $V_{CP1}$ after program pulse 1129. Instead of continuing and extending the first programming sequence to accommodate the slow memory cells, the second programming sequence applies a first program pulse with word line programming voltage equal to or higher than the last program pulse in the first programming sequence. As a result, the word line programming waveform in FIG. 11C shows a nearly-continuous increment in voltage from one programming sequence to the next, which is different from the word line programming waveform shown in FIG. 11B. In order to avoid "overshooting" the target threshold voltage of $V_{CP1}$ because of higher word line programming voltages during the second programming sequence, the drain voltage waveform CL1 is reduced from voltage $V_{D11}$ to voltage $V_{D12}$. Drain voltage waveforms, CL1, CL2, CL3, and CL4, in FIG. 11C, show similar drain voltage dependency on target threshold voltage as well as whether the target threshold voltage is being verified in the current programming sequence or subsequent programming sequence as shown in FIG. 11B. Restricting the maximum number of program pulses in early programming sequences can help to improve write-speed as well as provide a "seamless" transition among programming sequences.

Figure 11D:
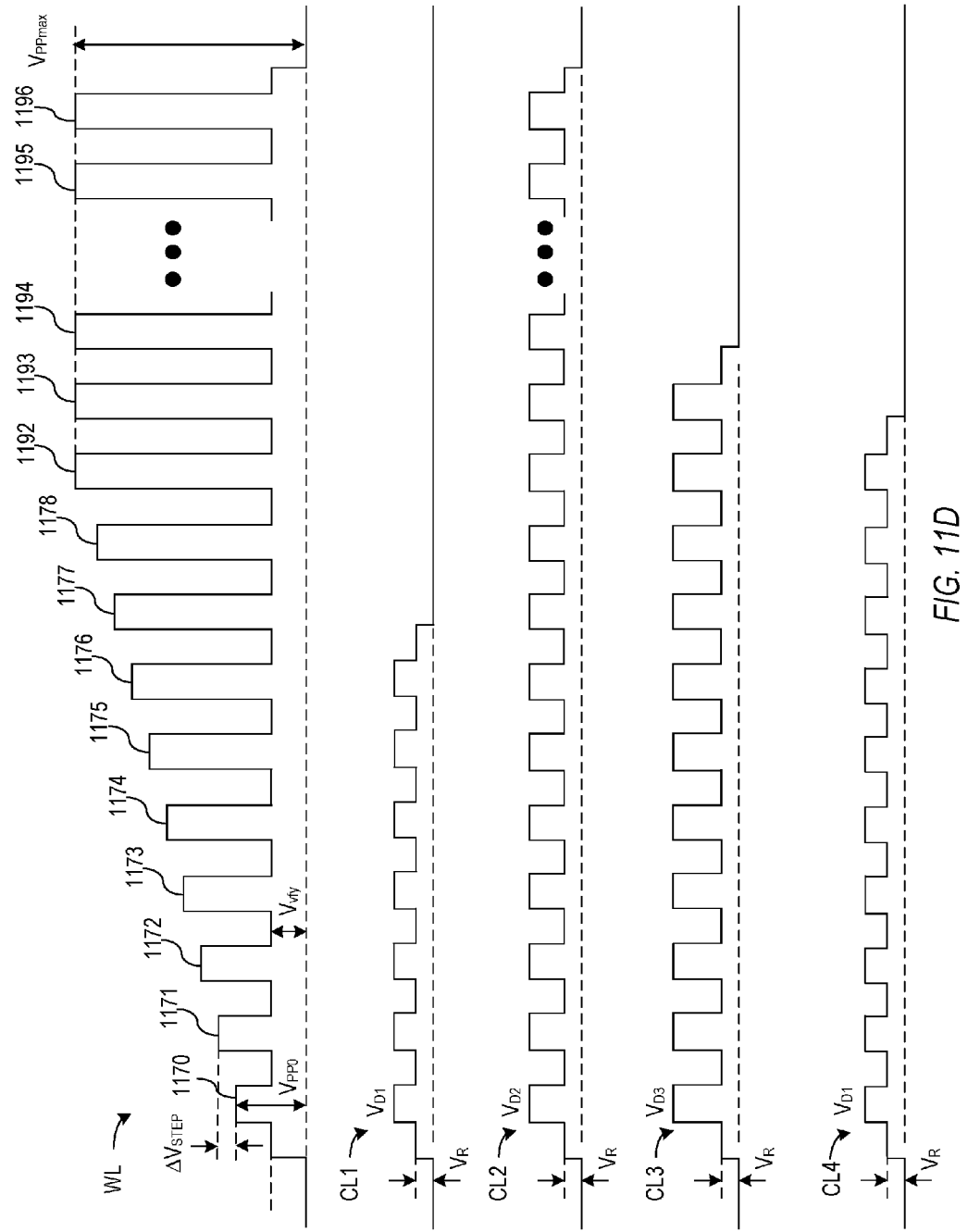

FIG. 11D shows an embodiment, which is useful for programming memory cells with a predictable programmed threshold voltage dependency on drain voltage, including bi-directional, nitride-based, localized charge trapping memory cell and the NAND Flash cell, which are based on Channel Hot Electron (CHE) injection and Fowler-Nordheim (FN) tunneling, respectively, for programming to different predetermined voltages or target threshold voltages. Instead of using different programming sequences for different predetermined voltages or target threshold voltages as shown in FIGS. 11B and 11C, the adaptive write operation illustrated in FIG. 11D uses a single programming sequence for all predetermined voltages or target threshold voltages. Programming is achieved by biasing the drain voltage of each selected memory cells according to their predetermined voltages or target threshold voltages, and incrementing the word line programming voltage from $V_{PP0}$ to $V_{PPmax}$. Ideally, the key programming parameters, which includes drain voltage, the initial word line programming voltage $V_{PP0}$, the final word line programming voltage $V_{PPmax}$, program pulse width, and the ramp rate for the word line programming voltage are determined by memory cell's programmed threshold voltage sensitivity to programming time and applied voltages (at the drain and gate) in order to achieve the best compromise between the desired programmed threshold voltage resolution and write time across the entire range of predetermined voltages or target threshold voltages. Preferably, the key programming parameters are selected such that the write time to reach any of the predetermined or target threshold voltages for a given memory cell is about the same and after the word line voltage has reached maximum voltage $V_{PPmax}$. As a result, overall write speed is improved because it is less limited by memory cells programmed to the highest target threshold voltages. Initial voltage $V_{PP0}$ and the word line programming voltage ramp rate, which can be uniform or non-uniform, are selected to limit the peak programming current during the initial write operation as well as to ensure the fast memory cells do not overshoot any target threshold voltages by an amount greater than the target resolution. Alternatively, the word line programming voltage can be a uniform voltage at voltage $V_{PPmax}$ or lower.

The drain voltage waveforms CL1, CL2, CL3, and CL4, in FIG. 11D are applicable for memory cells relying on Channel Hot Electron (CHE) injection for programming. Programming of NAND Flash memories can also use the same adaptive method shown in FIG. 11D, except that the timing may need to be extended and the drain voltage relationship to target threshold voltage may be changed in order to suit the FN tunneling characteristics. During programming of NAND Flash memory cells, the drain voltage is selected according to the target threshold voltage while the gate voltage is fixed to a high voltage. For example, if the difference between the highest and lowest target threshold voltages is greater than or equal to about 3 volts, drain voltages of less than or equal to about 1 volt and greater than or equal to about 4 volts can be used for the highest and lowest target threshold voltages, respectively. As a result, drain voltage $V_{D1}$ of waveforms CL1 and CL4 would require a higher voltage compared to drain voltage $V_{D3}$ of waveform CL3. Since tunneling current has an exponential dependency on electric field or voltage across the tunnel oxide, higher target threshold voltage with the lower drain voltage would result in a large tunneling current initially but decreases in time as the voltage across the tunnel oxide decreases, due to increasing threshold voltage of the memory cell. The larger threshold voltage shift per program pulse during the initial programming phase is acceptable when the programmed threshold voltage is far from the target threshold voltage. As memory cell's threshold voltage increases toward the target threshold voltage, tunneling current reduces exponentially resulting in smaller threshold voltage shifts or better resolution. In other words, the rate of threshold voltage increase as a function of program time for memory cells with the highest target threshold voltage would eventually converges to a level similar to the memory cells with the lowest target threshold voltage.

In FIG. 11D, waveforms CL3 and CL4 show two typical memory cells being programmed to predetermined threshold voltages $V_{CP3}$ and $V_{CP1}$ using drain voltages $V_{D3}$ and $V_{D1}$, respectively; where voltage $V_{D3}$ is higher than voltage $V_{D1}$. Waveforms CL1 and CL2 show a fast and slow memory cell being programmed to predetermined threshold voltages $V_{CP1}$ and $V_{CP2}$ using drain voltages $V_{D1}$ and $V_{D2}$, respectively; where voltage $V_{D2}$ is between voltages $V_{D1}$ and $V_{D3}$. The fast memory cell associated with waveform CL1 reaches the target threshold voltage quickly after a few program pulses 1170, 1171, 1172, 1173, 1174, 1175, and 1176, before the word line reaches maximum voltage $V_{PPmax}$. On the other hand, the very slow memory cell associated with waveform CL2 reaches the target threshold voltage after multiple program pulses 1170, 1171, 1172, 1173, 1174, 1175, 1176, 1177, and 1178, and 1192, 1193, 1194 to 1195, and 1196, after the word line reaches maximum voltage $V_{PPmax}$.

Alternate embodiments of the inventions shown in FIGS. 11B, 11C, and 11D can use program pulse count information and/or additional predetermined voltage(s) between target threshold voltages to further improve adaptiveness by dynamically adjusting the drain voltage higher or lower for slower or faster memory cells, respectively. For example, if the selected memory cell has not reached the predetermined threshold voltage after the program pulse count (within a programming sequence) reaches a predetermined number suggesting a slow memory cell, the drain voltage can be adjusted higher for subsequent program pulses. In contrast, if the predetermined voltage is reached after a pulse count suggesting a fast memory cell, the drain voltage can then be adjusted lower for subsequent program pulses. The adaptive write operations of FIGS. 11B and 11C would require additional programming sequences to accommodate the additional predetermined voltages between target threshold voltages. However, the embodiment in FIG. 11D does not use separate or well-defined programming sequences corresponding to different predetermined voltages or target threshold voltages as shown in FIGS. 11B and 11C, as the selected memory cells are verified to their respective target threshold voltages during the write operation.

Verify operations in FIGS. 3A, 4A, 4B, 4C, 4D, 4E, 5A, 5B, 11C, and 11D use a fixed verify word line voltage; whereas, verify operations in FIGS. 7, 8A, 8B, 9, 10B, 10C, 10D, and 11B use a variable verify word line voltage dependent on the predetermined voltages to which the memory cells are being programmed. Since both verify schemes are capable of verifying whether the memory cell being programmed has reached the predetermined voltages or target threshold voltages, the adaptive programming methods disclosed in here can use either verify schemes without departure from the spirit and scope of the present invention. For example, the write operations shown in 7, 8A, 8B, 9, 10B, 10C, 10D, and 11B can alternatively use a fixed word line voltage to gate both the selected memory cells and reference cells during verify operations; whereas, the write operations shown in FIGS. 3A, 4A, 4B, 4C, 4D, 4E, 5A, 5B, 11C, and 11D can alternatively use a variable word line voltage corresponding to the predetermined voltage during verify operations.

Verify operations shown in FIGS. 3A, 4A, 4B, 4C, 4D, 4E, 5A, 5B, 11C, and 11D use a fixed verify word line voltage $V_{VFY}$ to gate both the selected memory cells as well as the selected reference cells, which have threshold voltages corresponding to the predetermined voltages that the selected memory cells are being programmed to. During the write operation, as soon as the cell currents through the memory cell and its respective reference cell are comparable within a tight tolerance, the verify sense amplifier would trigger an output signal to terminate further programming of that selected memory cell. The verify approach can thus employ multiple reference cells that are pre-set or pre-programmed to different predetermined or target threshold voltages.

Verify operations shown in FIGS. 7, 8A, 8B, 9, 10B, 10C, 10D, and 11B use a variable word line voltage to gate both the selected memory cells as well as the selected reference cells, which have threshold voltages corresponding to the predetermined voltages to which the selected memory cells are being programmed. The reference cells are pre-set or pre-programmed by using a similarly variable word line voltage corresponding to the predetermined voltages during the reference cell's verify operation before actual data is allowed to be written into the memory array. As a result, both memory cells and reference cells are consistently biased in the same operating region (e.g. same floating-gate and drain voltages), and reference cell currents (e.g., 10 μA) are also similar across all predetermined voltages or the entire dynamic threshold voltage range during verify operations. In comparison, the verify operations shown in FIGS. 3A, 4A, 4B, 4C, 4D, 4E, 5A, 5B, 11C, and 11D, which use a fixed word line voltage $V_{VFY}$ to gate both the selected memory cells and the selected reference cells, would cause the selected reference cells to be biased in different operating regions depending on the predetermined voltages. For example, a fixed $V_{VFY}$ voltage of 6 v gated to a reference cell with a predetermined voltage of 3.5 v would result in a large gate over-drive of 2.5 v, which may cause the memory cell to be biased near the linear region where cell current variations is less sensitive to threshold voltage shifts. On the other hand, a fixed $V_{VFY}$ voltage of 6 v gated to a reference cell corresponding to a predetermined voltage of about 6 v would result in little or no gate over-drive, which causes the memory cell to be biased near the saturation region where cell current is most sensitive to threshold voltage shifts. Therefore, a verify word line voltage, which varies according to the predetermined voltage that the selected memory cell is being programmed to, is preferable (over fixed verify word line voltage) because it provides a uniform and consistent biasing of both reference cells and memory cells in the same (optimal) operating region, across all predetermined voltages or targets threshold voltages during the verify operations. After the multi-bit data is written into a memory cell, a similar technique of varying the word line voltage can improve the read operation.

FIG. 6B shows a number of predetermined voltages that represent both target threshold voltages (e.g., $V_{TT1}=V_{CP2}$, $V_{TT2}=V_{CP4}$, $V_{TT3}=V_{CP6}$, and $V_{TT4}=V_{CP8}$, etc.) as well as non-target threshold voltages (e.g., $V_{CP1}$, $V_{CP3}$, $V_{CP5}$, and $V_{CP7}$, etc.), which are in between target threshold voltages.

Table 2 below shows an example of predetermined voltages and target threshold voltages representing a 2-bit or 4-level data storage per cell:

TABLE 2

| Memory Cell with Target Threshold Voltage | Reference Cell with Predetermined Voltages | 2-bit Binary Data |
|---|---|---|
| $V_{TT3}$ | $V_{CP6}$ $V_{CP5}$ | "00" |
| $V_{TT2}$ | $V_{CP4}$ $V_{CP3}$ | "01" |
| $V_{TT1}$ | $V_{CP2}$ $V_{CP1}$ | "10" |
| Erased $V_T$ |  | "11" |

In addition to being applicable for adaptive write operation, predetermined voltages that are not the target threshold voltages can also be utilized for high-performance multi-level cell (MLC) read operations. For example, currents through selected memory cells with target threshold voltages are compared against selected reference cells with predetermined voltages that are between target threshold voltages. By selecting the proper reference cell in each of the two consecutive read cycles, the binary representation of the stored charge in the selected memory cell can be accurately determined by first reading the most-significant-bit (MSB) in the first read cycle and then reading the least-significant-bit (LSB) in the second read cycle.

Figure 12:
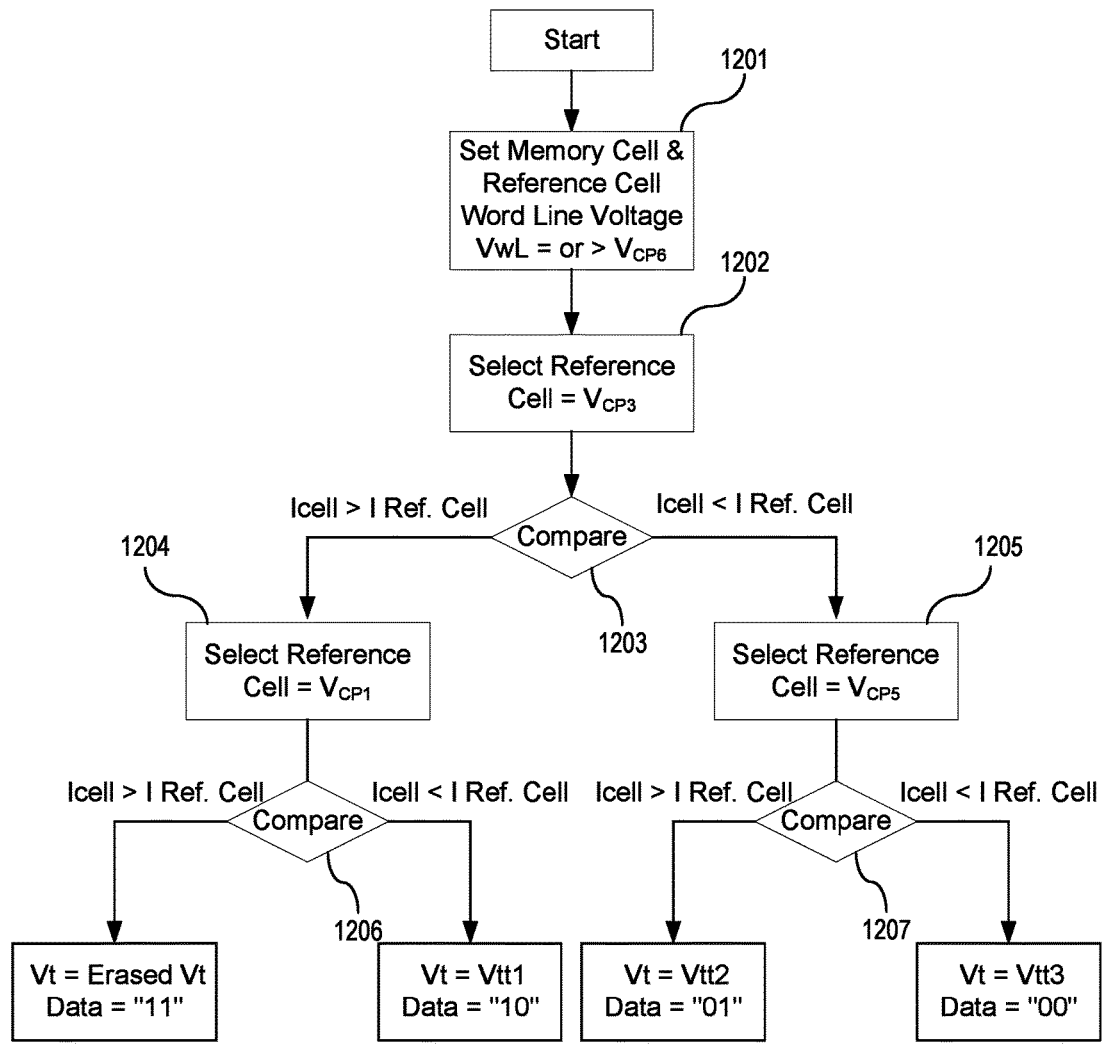
FIG. 12 shows a flow chart of a two-cycle read operation for a two-bit per cell memory in accordance with an embodiment of the invention having a continuous or common word line array architecture.

FIG. 12 shows a flow chart of an iterative, two-cycle read operation for a two-bit per cell memory based on a continuous or common word line array architecture using a single sense amplifier. During a first read cycle, the current through the selected memory cell is compared to the current through a reference cell having threshold voltage $V_{CP3}$ in steps 1202 and 1203. Memory and reference cell word line voltages are fixed and set higher than or equal to $V_{CP6}$, as shown in step 1201, to ensure sufficient gate voltage for cells with higher target threshold voltages. Alternatively, the memory and reference cell word line voltages can be about equal to threshold voltage $V_{CP3}$. When current through the selected memory cell is greater than the current through the reference cell having threshold voltage $V_{CP3}$, which is indicative of the memory cell having a threshold voltage lower than voltage $V_{CP3}$, a reference cell with a threshold voltage $V_{CP1}$ lower than voltage $V_{CP3}$ will be used during the second read cycle, as shown in step 1204. In the case when the current through the selected memory cell is less than the current through the reference cell having threshold voltage $V_{CP3}$, which is indicative of the memory cell having a threshold voltage higher than voltage $V_{CP3}$, a reference cell having threshold voltage $V_{CP5}$ will be used during the second read cycle, as shown in step 1205. A similar comparison between the selected memory cell and reference cell currents is again performed to determine the two-bit binary equivalent of the multi-level charge stored in the selected memory cell, as shown in comparison steps 1206 and 1207.

Figure 13:
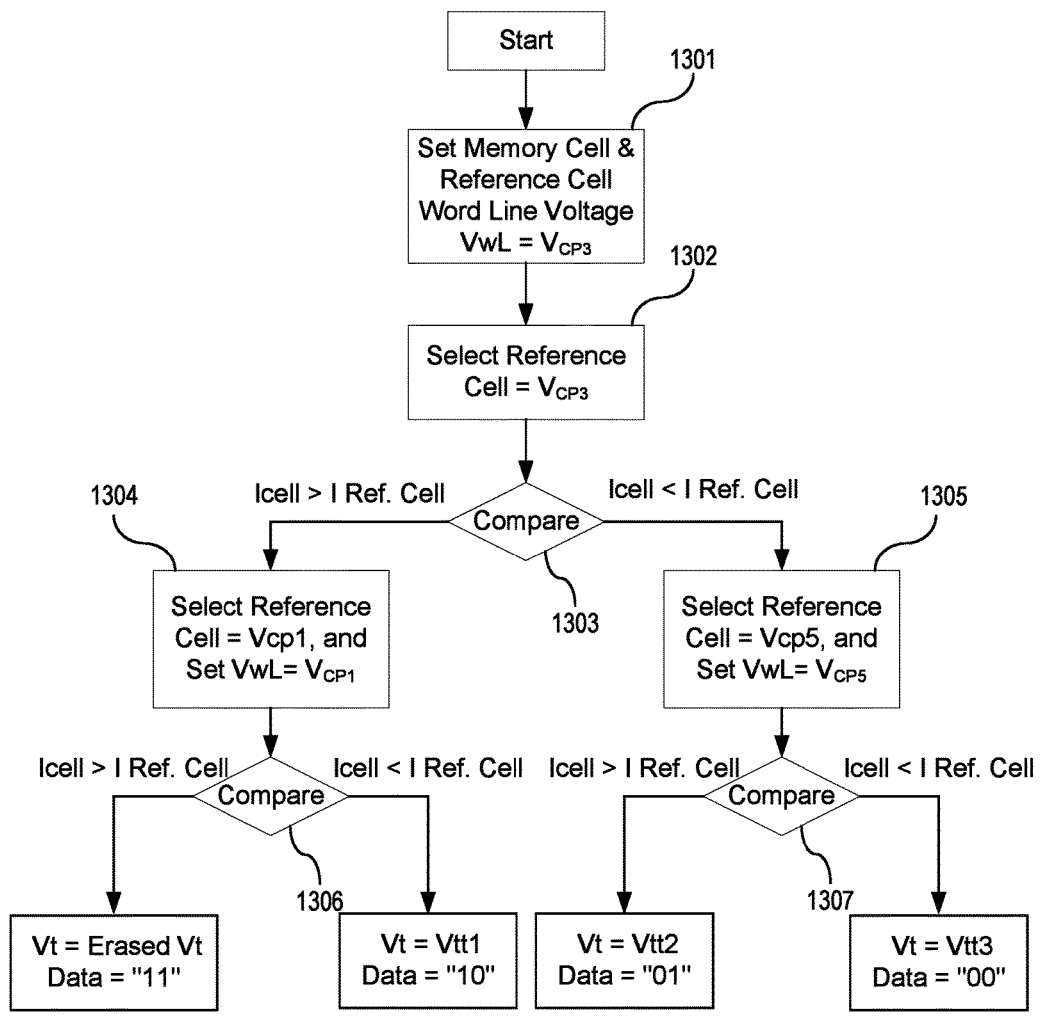
FIG. 13 shows a flow chart of an adaptive two-cycle read operation for a two-bit-per-cell memory in accordance with an embodiment of the invention having a segmented word line array architecture.

FIG. 13 shows a flow chart of an adaptive two-cycle read operation for a two-bit per cell memory based on a segmented word line array architecture using a single sense amplifier. Memory and reference cell word line voltages are dynamically adjusted to correspond to the threshold voltage of the selected reference cell in each of the two read cycles. During the first read cycle, memory and reference cell word line voltages are set at about equal to voltage $V_{CP3}$ as shown in step 1301. A reference cell having threshold voltage $V_{CP3}$ is used to compare the current difference through the selected memory cell and the reference cell, as shown in steps 1302 and 1303. When current through the selected memory cell is greater than the current through the reference cell corresponding to voltage $V_{CP3}$, which is indicative of the memory cell having a threshold voltage lower than voltage $V_{CP3}$, a reference cell with threshold voltage $V_{CP1}$ lower than voltage $V_{CP3}$ as well as memory and reference cell word line voltages of about $V_{CP1}$ will be used during the second read cycle, as shown in step 1304. In the case when the current through the selected memory cell is less than the current through the reference cell corresponding to voltage $V_{CP3}$, which is indicative of the memory cell having a threshold voltage higher than voltage $V_{CP3}$, reference cell corresponding to $V_{CP5}$ as well as memory and reference cell word line voltages of about $V_{CP5}$ will be used during the second read cycle, as shown in step 1305. A similar comparison between the selected memory cell and reference cell currents is again performed to determine the two-bit binary equivalent of the multi-level charge stored in the selected memory cell, as shown in comparison steps 1306 and 1307.

Figure 14:
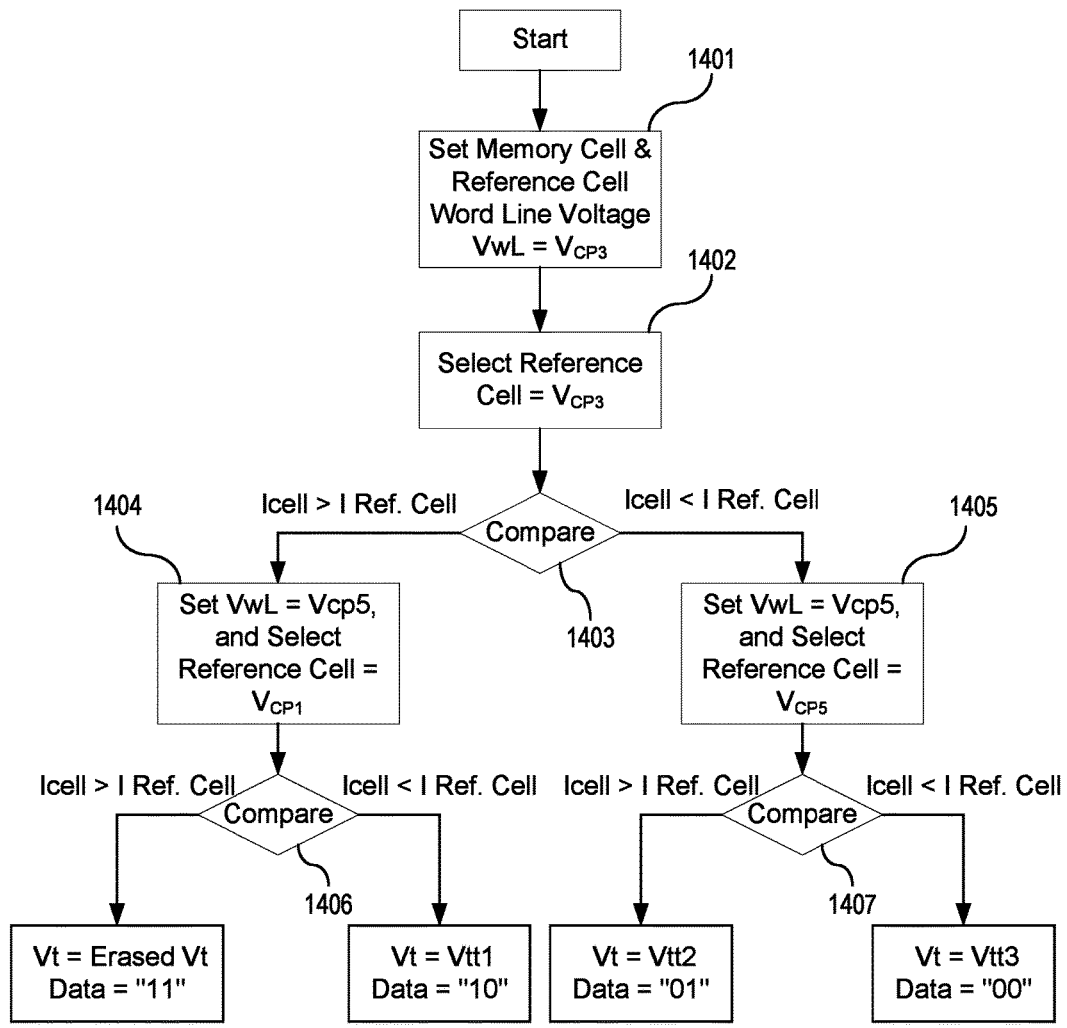
FIG. 14 shows a flow chart of an adaptive two-cycle read operation for a two-bit-per-cell memory in accordance with an embodiment of the invention having a continuous or common word line array architecture.

FIG. 14 shows a flow chart of another embodiment of an adaptive two-cycle read operation for a two-bit per cell memory with a continuous or common word line array architecture using a single sense amplifier. Memory and reference cell word line voltages are adjusted to correspond to the threshold voltage of the selected reference cell in the first of the two read cycles. During the first read cycle, reference cell corresponding to predetermined voltage $V_{CP3}$ and memory and reference cell word line voltages of about voltage $V_{CP3}$ are used to compare the current difference through the selected memory cell and the reference cell, as shown in steps 1401, 1402, and 1403. When current through the selected memory cell is greater than the current through the reference cell corresponding to voltage $V_{CP3}$, which is indicative of the memory cell having a lower threshold voltage compared to voltage $V_{CP3}$, the reference cell with threshold voltage $V_{CP1}$ will be used during the second read cycle, as shown in step 1404. In the case when the current through the selected memory cell is less than the current through the reference cell corresponding to voltage $V_{CP3}$, which is indicative of the memory cell having a higher threshold voltage compared to voltage $V_{CP3}$, the reference cell corresponding to voltage $V_{CP5}$, will be used during the second read cycle, as shown in step 1405. For both cases, memory and reference cell word line voltages of about $V_{CP5}$ are used in the second read cycle to determine the two-bit binary equivalent of the multi-level charge stored in the selected memory cell, as shown in comparison steps 1406 and 1407.

Selecting both the word line and reference word line voltages to a mid-level in the first read cycle would effectively bias the selected reference cell and memory cell (with threshold voltages close to the selected reference cell's) in an operating region in which the current flow is most sensitive to threshold voltage shifts. Memory cell with threshold voltages that are far way from selected reference cell's threshold voltage would not be biased in the same optimal operating region. However, this deficiency is sufficiently compensated by the increased threshold voltage window. Another advantage of setting the word line and reference word line voltages initially to a mid-level instead of a full-level during the first read cycle, as shown in FIGS. 13 and 14, reduces the charging time required by the word line decoder driver circuit, which effectively improves the read access time.

Use of variable word line voltages during both verify and adaptive read operations provide a consistent and uniform biasing of selected reference cells and memory cells in an optimal operating region in which current flow is most sensitive to threshold voltage shifts. Furthermore, it would eliminate or substantially reduce the normal offsets between verify and read operations. As a result, the delta signal is maximized for the sensing circuit to accurately read out the multi-bit value stored in the memory cell.

Continuous or common word line array architectures for two-bits-per-cell memories have a drawback in that the read word line voltage cannot be set to any level other than the full-level during the second read cycle. To reduce the impact of this limitation, an alternative embodiment of the invention uses independent source-biasing of selected memory cells to enhance the adaptive read operation during the second read cycle shown in FIG. 14. For example, if the reference cell corresponding to voltage $V_{CP5}$ is selected during the first read cycle, the source voltage of the selected memory cell is biased normally, to near ground potential. However, if the reference cell corresponding to voltage $V_{CP1}$ is selected, indicating the memory cell has low target threshold voltages corresponding to either data "11" or "10", the source voltage of the selected memory cell can be biased higher than ground potential. Elevating the source voltage effectively increases the threshold voltage of the memory cell, which helps to maintain the memory cell in an optimal operating region in which cell current is most sensitive to threshold voltage shifts. Independent source voltage control requires individual source-biasing circuits and electrically isolated source lines associated with each selected memory cells or bit lines, which are different than those illustrated in FIGS. 1 and 2.

The read operation illustrated in FIGS. 12, 13, and 14 are applicable for N-bit multi-level memories, where N can be 2 or more. Storing N bits in any memory cell generally requires programming that can set a transistor to any of the ($2^N-1$) or $2^N$ different target threshold voltage levels depending on whether the initial threshold voltage is used to represent a data value. Different threshold voltages provided by the reference cells may be required for verify and read operations. For example, ($2^N-1$) or $2^N$ reference voltage levels corresponding to the target threshold voltages may be used verify that memory cells have been programmed to the ($2^N-1$) or $2^N$ target threshold voltages. Reading a memory cell storing N bits of data generally requires ($2^N-1$) reference voltage levels that are between target threshold voltages. For example, each of the $2^N$ different target threshold voltage levels can be identified as being lower than the lowest reference voltage level, between two consecutive reference voltage levels, or higher than the highest reference voltage level. Therefore, writing and reading multi-level memories storing N bits of data typically require reference cells providing $2\times(2^N-1)$ or ($2^{N+1}-1$) predetermined voltages, which includes both target threshold voltages as well as non-target threshold voltages, which are in between target threshold voltages.

If the initial (or erased) threshold voltage represents one of the $2^N$ data values, ($2^N-1$) target threshold voltages and $2\times(2^N-1)$ total predetermined voltages will normally be required. On the other hand, if the initial threshold voltage is not one of the $2^N$ threshold voltage levels, $2^N$ target threshold voltages and ($2^{N+1}-1$) predetermined voltages may be required. For either case, N consecutive read cycles could be used to accurately read the memory cell storing N bits of data using a single sense amplifier. For example, for 4-bit per cell storage where the initial threshold voltage is one of the $2^N$ or 16 target threshold voltages, a total of 30 predetermined voltages, which consists of 15 target threshold voltages and 15 non-target threshold voltages, and 4 consecutive read cycles can be used to read the 4-bit memory cell using a single sense amplifier and a "binary-search" read process similar to the processes shown in FIGS. 12, 13, and 14. While this method achieves the smallest circuit layout overhead and minimum power consumption, the large penalty in read access time could be prohibitive for applications requiring high-performance random access.

Alternatively, a single read cycle operation could be used for reading N-bit per cell memories by comparing the current through the selected memory cell to currents through $(2^N-1)$ reference cells in parallel. However, this method typically requires $(2^N-1)$, e.g., fifteen sense amplifiers per memory cell read for a 4-bit-per-cell memory, resulting in substantially more power consumption and circuit overhead. Also, any mismatches and offsets among the large number of sense amplifiers would effectively reduce the sensing margin and read speed, and increase the probability of read errors.

Figure 15:
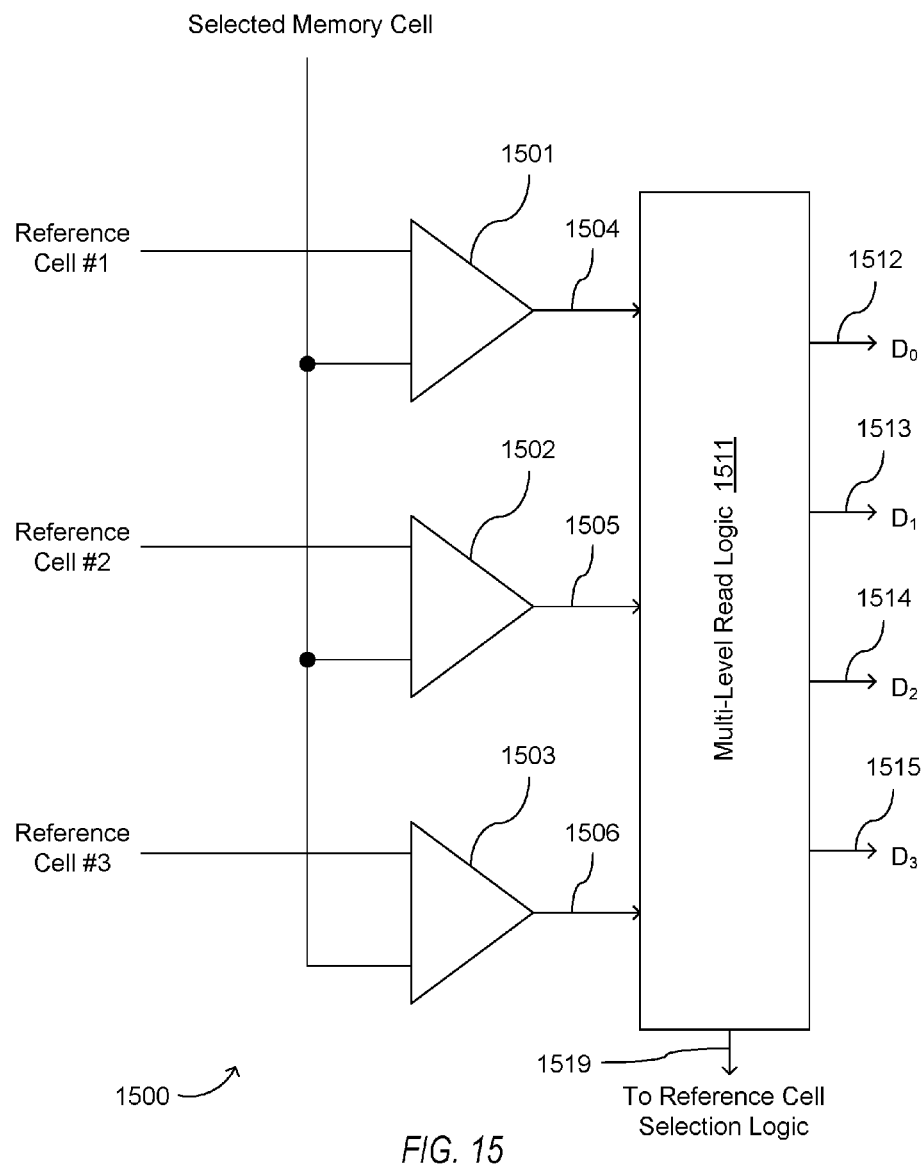
FIG. 15 shows a read circuit suitable for reading a memory cell storing 4 bits of data or sixteen threshold voltage levels.

Alternatively, a two-cycle read operation reading a N-bit memory cell, when N is even, can be completed using $(2^{N/2}-1)$ sense amplifiers. For example, for N=4, three (3) sense amplifiers requiring only two (2) consecutive read cycles can determine the 4-bit value represented by the charge stored in the selected memory cell. FIG. 15 shows a read circuit suitable for reading a memory cell storing 4 bits of data or sixteen (16) threshold voltage levels. Read circuit 1500 consists of three comparators 1501, 1502, and 1503, and multi-level read logic 1511. The first of the inputs to comparators 1501, 1502, and 1503 are connected to reference cells providing three different references. The second of the two inputs to each of comparators 1501, 1502, and 1503 have a common connection to the selected memory cell. Outputs 1504, 1505, and 1506 of comparators 1501, 1502, and 1503 are connected to multi-level read logic 1511, which has two sets of outputs. The first set of outputs 1519 consists of a data bus to the local reference cell selection logic (not shown); and the second set of outputs is a 4-bit wide data bus consisting of outputs 1512 ($D_0$), 1513 ($D_1$), 1514 ($D_2$), and 1515 ($D_3$) representing the 4-bit data value stored in the selected memory cell.

Figure 16:
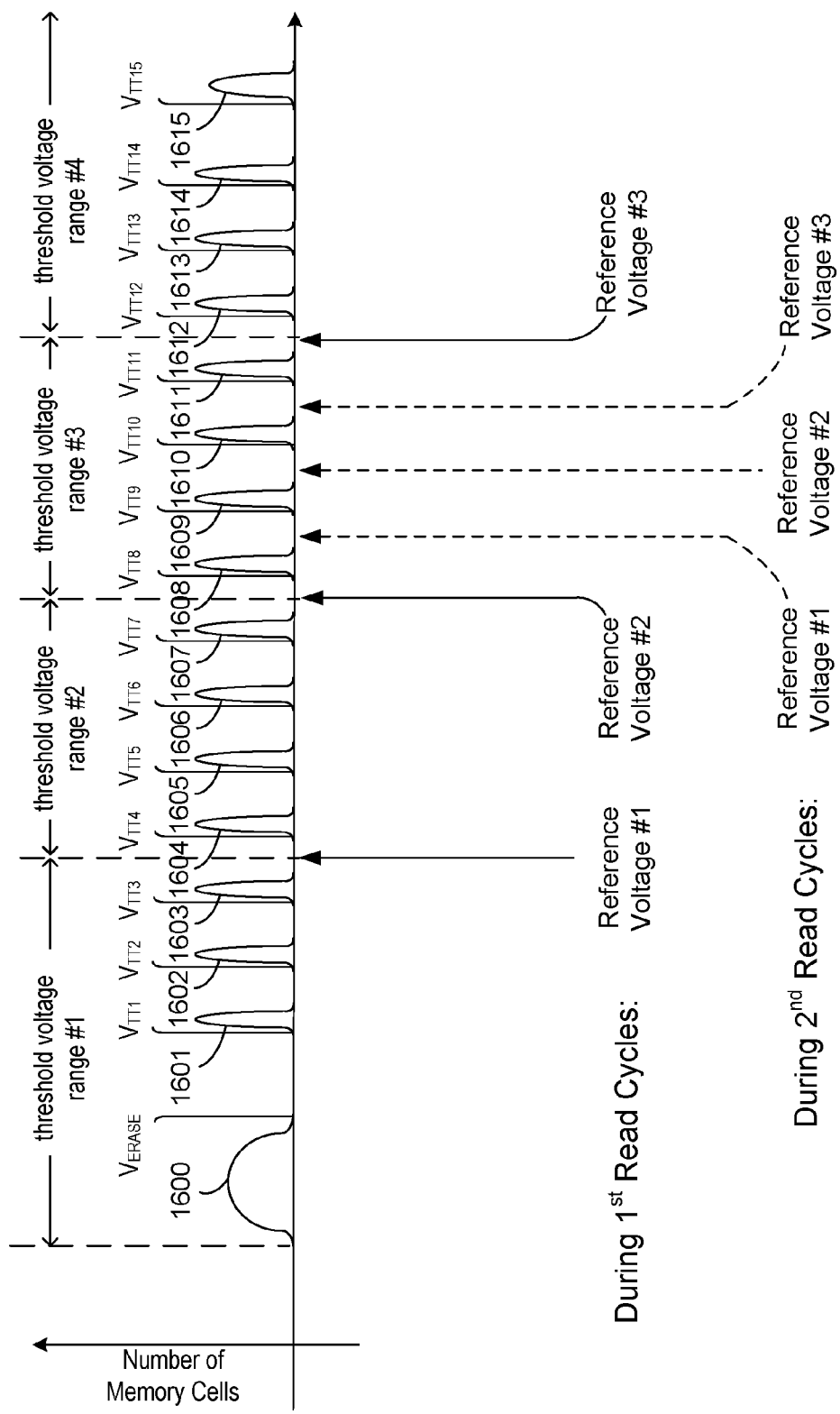
FIG. 16 shows threshold voltage distributions after an erase operation and write operations in a memory array storing four bits per cell.

To illustrate a two-cycle read operation using the circuitry shown in FIG. 15 to identify a 4-bit value, FIG. 16 shows an example of the threshold voltage distributions 1600, 1601, 1602, 1603, 1604, 1605, 1606, 1607, 1608, 1609, 1610, 1611, 1612, 1613, 1614, and 1615 after an erase operation and write operations in a memory array storing four bits per cell, similar to those shown in FIG. 6A. The sixteen threshold voltage levels (consisting of initial threshold voltage $V_{ERASE}$ and fifteen target threshold voltages, $V_{TT1}$ to $V_{TT15}$) are divided into four threshold voltage ranges (threshold voltage range #1 to threshold voltage range #4), each encompassing four consecutive threshold voltage levels. For example, threshold voltage range #1 encompasses $V_{ERASE}$, $V_{TT1}$, $V_{TT2}$, and $V_{TT3}$; whereas, threshold voltage range #3 encompasses $V_{TT8}$, $V_{TT9}$, $V_{TT10}$, and $V_{TT11}$.

During the first read cycle, the read operation identifies which of the four threshold voltage ranges the selected memory cell's threshold voltage belongs to by comparing selected memory cell's threshold voltage against a first set of three reference cells that have threshold voltage levels that are about equally spaced across the dynamic threshold voltage range from $V_{ERASE}$ to $V_{TT15}$. Reference cell #1 has a threshold voltage level between target voltages $V_{TT3}$ and $V_{TT4}$, reference cell #2 has a threshold voltage level between target voltages $V_{TT7}$ and $V_{TT8}$, and reference cell #3 has a threshold voltage level between target voltages $V_{TT11}$ and $V_{TT12}$. Based on the results of the first read cycle, multi-level read circuit 1511 identifies a second set of three reference cells to be used for comparison in the second read cycle. For example, comparator outputs 1504, 1505, and 1506 have a value of "000b" indicating memory cell's threshold voltage is within threshold voltage range #1, three reference cells that have threshold voltages within the same threshold voltage range #1 would be selected by providing the appropriate input values to the reference cell selection logic (not shown) via data bus 1519. However, if comparator outputs 1504, 1505, and 1506 have a value of "110b" indicating memory cell's threshold voltage is within threshold voltage range #3, three reference cells that have threshold voltages within the same threshold voltage range #3 would be selected instead.

During the second read cycle, the read operation further narrows down selected memory cell's exact threshold voltage within the identified threshold voltage range by comparing selected memory cell's threshold voltage against the second set of three reference cells with threshold voltage levels that are about equally spaced apart across the identified threshold voltage range. For example, as shown in FIG. 16, if memory cell's threshold voltage is identified to be within threshold voltage range #3 in the first read cycle, then the second set of selected reference cells would have threshold voltage levels between $V_{TT8}$ and $V_{TT9}$, between $V_{TT9}$ and $V_{TT10}$, and between $V_{TT10}$ and $V_{TT11}$, respectively. Based on the results of the first and second read cycles, multi-level read circuit 1511 determines the 4-bit data value representing the threshold voltage of the selected memory cell, and sends the results onto outputs 1512, 1513, 1514, and 1515. For example, if selected memory cells threshold voltage is about equal to $V_{TT10}$, comparator outputs 1504, 1505, and 1506 would be "110b" and multi-level read logic 1511 would then send a value of "0101b" to the 4-bit wide data bus 1512, 1513, 1514, and 1515. Additional data registers and output buffers (not shown) will then transfer these 4-bit data along with other selected memory cells' data to the memory device's I/O pins. The embodiments as shown in FIGS. 15 and 16, which uses a 2-cycle read operation, can achieve high-speed random access without significant sacrifices in both circuit overhead and power consumption.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A programming method for a non-volatile memory, comprising:
    (a) simultaneously applying a first programming voltage as a program pulse to a plurality of selected memory cells during a write process that changes respective threshold voltages of the selected memory cells;
    (b) repeating step (a) until the threshold voltages of the selected memory cells reach respective target threshold voltages that represent multi-bit data values respectively being written to the selected memory cells, wherein before each of these repetitions of the step (a), the first programming voltage is increased by a voltage increment until the first programming voltage has reached a maximum allowable voltage;
    (c) applying a plurality of second programming voltages respectively to the selected memory cells during repetitions of step (a), wherein each of the second programming voltages has a maximum value and a minimum value as a program pulse; and (d) in response to a first selected memory cell from among the plurality of selected memory cells failing to reach a predetermined threshold voltage after a sequence of repetitions of step (a), reducing the maximum value of the second programming voltage that is applied to the first selected memory cell during subsequent repetitions of step (a) to result in a reduced second programming voltage during subsequent repetitions of step (a) that has a reduced maximum value, the subsequent repetitions continuing to increase the voltage increment of the first programming voltage according to step (b), wherein the maximum value of the reduced second programming voltage has a voltage level between the minimum value and the maximum value of the applied plurality of second programming voltages prior to the reduction.

2. The method of claim 1, further comprising changing the second programming voltages when the threshold voltages of the selected memory cells to which the second programming voltages are applied near their respective target threshold voltages.

3. The method of claim 1, wherein simultaneously applying the first programming voltage to the plurality of selected memory cells comprises applying the first programming voltage to a word line coupled to the selected memory cells.

4. The method of claim 3, wherein applying the second programming voltages comprises applying the second programming voltages respectively to column lines connected to the selected memory cells.

5. The method of claim 1, wherein the predetermined threshold voltage is the target threshold voltage for the first selected memory cell.

6. The method of claim 1, wherein the predetermined threshold voltage is an intermediate threshold voltage for the first selected memory cell.

7. The method of claim 1, wherein reducing the second programming voltage that is applied as a program pulse to the first selected memory cell during subsequent repetitions of step (a) includes reducing the second programming voltage that is applied as a program pulse to the first selected memory cell to apply a reduced second programming voltage during subsequent consecutive repetitions of step (a).

8. The method of claim 1, wherein each first programming voltage program pulse is applied at the same time as each respective second programming voltage program pulse.

9. The method of claim 8, wherein each first programming voltage program pulse applied at the same time as a respective second programming voltage program pulse has the same pulse width as the respective second programming voltage program pulse.

10. The method of claim 8, wherein a verify voltage is applied between each repetition of the first programming voltage program pulse and between each repetition of the second programming voltage program pulse.

11. A programming method for a non-volatile memory, comprising:
(a) simultaneously applying a first programming voltage as a program pulse to a plurality of selected memory cells during a write process that changes respective threshold voltages of the selected memory cells;
(b) during a first period of time, repeating step (a) until the threshold voltages of the selected memory cells reach respective target threshold voltages that represent multi-bit data values respectively being written to the selected memory cells, wherein before each of these repetitions of the step (a), the programming voltage is increased by a voltage increment;
(c) during the first period of time, applying a plurality of second programming voltages respectively to the selected memory cells during repetitions of step (a), wherein each of the second programming voltages has a maximum value and a minimum value as a program pulse; and
(d) in response to a first selected memory cell from among the plurality of selected memory cells failing to reach a predetermined threshold voltage after a sequence of repetitions of step (a), during a second period of time following the first period of time, reducing the second programming voltage that is applied as a program pulse to the first selected memory cell during subsequent repetitions of step (a), to result in a reduced second programming voltage during subsequent repetitions of step (a) that has a reduced maximum value, the subsequent repetitions continuing to increase the voltage increment of the first programming voltage according to step (b), wherein the maximum value of the reduced second programming voltage has a voltage level between the minimum value and the maximum value of the second programming voltages applied during the first period of time.

12. The method of claim 11, wherein reducing the second programming voltage that is applied as a program pulse to the first selected memory cell during subsequent repetitions of step (a) includes reducing the second programming voltage that is applied as a program pulse to the first selected memory cell to apply a reduced second programming voltage during subsequent consecutive repetitions of step (a).

13. The method of claim 11, wherein each first programming voltage program pulse is applied at the same time as each respective second programming voltage program pulse.

14. The method of claim 13, wherein each first programming voltage program pulse applied at the same time as a respective second programming voltage program pulse has the same pulse width as the respective second programming voltage program pulse.

15. The method of claim 13, wherein a verify voltage is applied between each repetition of the first programming pulse and between each repetition of the second programming pulse.

16. The method of claim 11, wherein all of the first program voltages applied during the first period of time are lower than any of the first program voltages applied during the second period of time.

* * * * *